United States Patent
Yang et al.

(10) Patent No.: US 11,443,810 B2
(45) Date of Patent: Sep. 13, 2022

(54) NEGATIVE LEVEL SHIFTERS AND NONVOLATILE MEMORY DEVICES INCLUDING THE SAME

(71) Applicant: SAMSUNG ELECTRONICS CO., LTD., Suwon-si (KR)

(72) Inventors: Sooyeol Yang, Hwaseong-si (KR); Hyunggon Kim, Hwaseong-si (KR); Youngsun Song, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/220,368

(22) Filed: Apr. 1, 2021

(65) Prior Publication Data
US 2022/0084600 A1 Mar. 17, 2022

(30) Foreign Application Priority Data
Sep. 16, 2020 (KR) .......... 10-2020-0119086

(51) Int. Cl.
*G11C 16/12* (2006.01)
*H01L 27/11582* (2017.01)
*H01L 27/11573* (2017.01)

(52) U.S. Cl.
CPC ........ *G11C 16/12* (2013.01); *H01L 27/11573* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 5,973,967 A | * | 10/1999 | Nguyen .......... G11C 16/08 365/185.12 |
| 6,556,061 B1 | | 4/2003 | Chen et al. |
| 7,705,630 B1 | * | 4/2010 | Huang .......... H03K 19/018521 326/63 |
| 8,270,234 B1 | | 9/2012 | Tang et al. |
| 8,854,348 B2 | | 10/2014 | Cho |
| 9,024,674 B1 | | 5/2015 | Kim |
| 9,361,995 B1 | | 6/2016 | Tran et al. |
| 10,153,771 B2 | | 12/2018 | Ryu et al. |
| 10,367,504 B1 | | 7/2019 | Cheng |
| 10,447,252 B2 | | 10/2019 | Hwang et al. |
| 10,483,962 B2 | | 11/2019 | Shin et al. |
| 2004/0129996 A1 | | 7/2004 | Shin |

(Continued)

*Primary Examiner* — Tan T. Nguyen
(74) *Attorney, Agent, or Firm* — Lee IP Law, P.C.

(57) ABSTRACT

A negative level shifter includes a shifting circuit and a latch circuit. The shifting circuit shifts levels of a first input signal and a second input signal to provide a first output signal and a second output signal having complementary levels at a first output node and a second output node, respectively, using low voltage transistors and high voltage transistors having different characteristics. The latch circuit, connected to the shifting circuit at the first output node and the second output node, latches the first output signal and the second output signal, receives a negative voltage having a level smaller than a ground voltage, and drives the second output signal and the first output signal complementarily to either a level of a power supply voltage or a level of the negative voltage, based on voltage levels at the first output node and the second output node, respectively.

20 Claims, 22 Drawing Sheets

(56) References Cited

U.S. PATENT DOCUMENTS

2012/0020146 A1* 1/2012 Jung .................. G11C 11/413
                                                    365/230.06
2016/0365063 A1   12/2016 Seo et al.
2019/0259455 A1*  8/2019 Kashihara ............. G11C 16/14

* cited by examiner

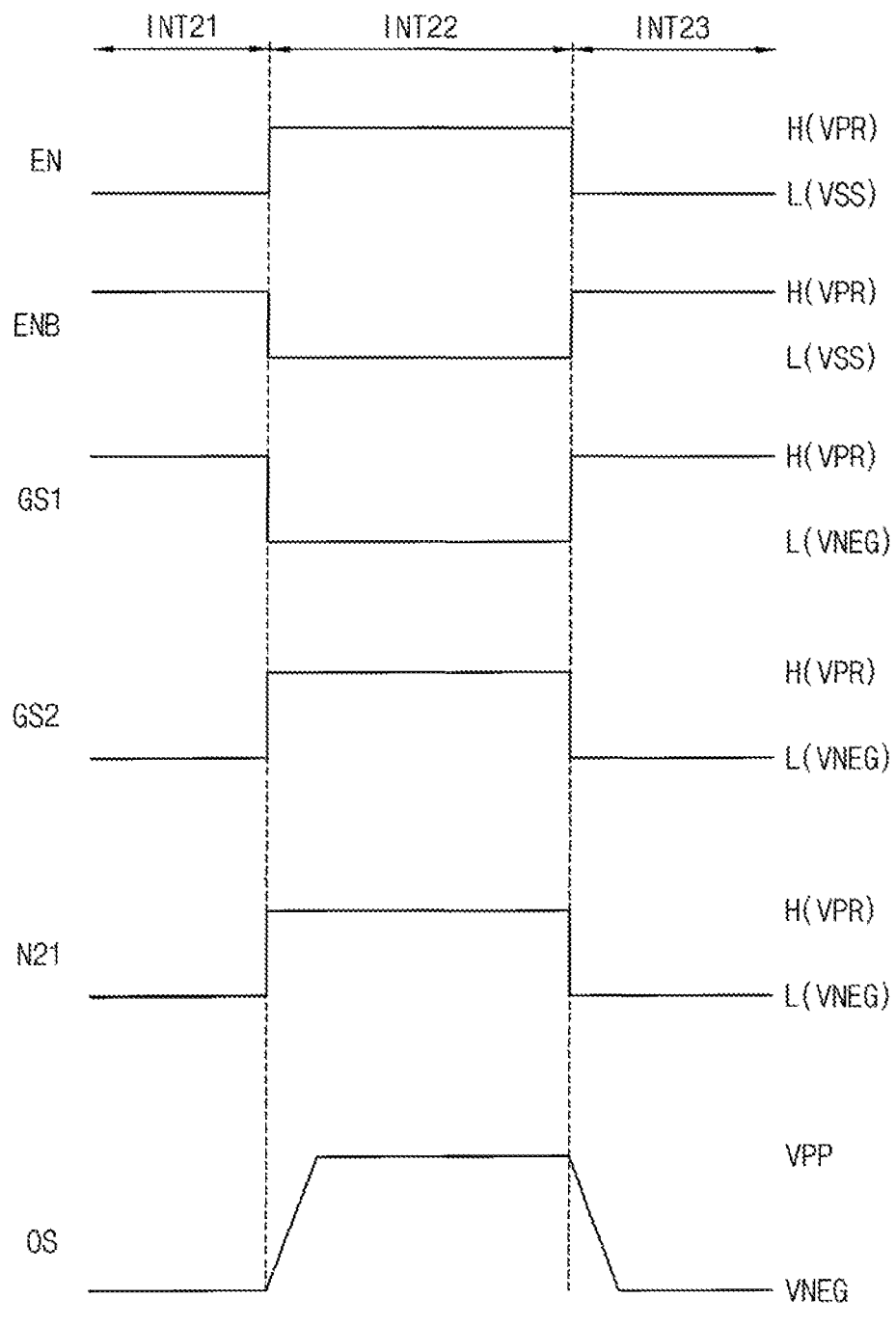

NEGATIVE LEVEL SHIFTERS AND NONVOLATILE MEMORY DEVICES INCLUDING THE SAME

CROSS-REFERENCE TO RELATED APPLICATION

Korean Patent Application No. 10-2020-0119086, filed on Sep. 16, 2020 in the Korean Intellectual Property Office, and entitled: "Negative Level Shifters and Nonvolatile Memory Devices Including the Same," is incorporated by reference herein in its entirety.

BACKGROUND

1. Field

Embodiments relate generally to semiconductor devices, and more particularly to negative level shifters and nonvolatile memory devices including the same.

2. Description of the Related Art

Semiconductor memory devices can generally be divided into two categories depending upon whether or not they retain stored data when disconnected from a power supply. These categories include volatile memory devices, which lose stored data when disconnected from power, and nonvolatile memory devices, which retain stored data when disconnected from power. Volatile memory devices may perform read and write operations at a high speed, while contents stored therein may be lost at power-off. Nonvolatile memory devices may retain contents stored therein even at power-off, which means they may be used to store data that must be retained regardless of whether they are powered. Examples of nonvolatile memory devices include a flash memory.

SUMMARY

Embodiments are directed to a negative level shifter in a nonvolatile memory device, the negative level shifter including: a shifting circuit configured to shift levels of a first input signal and a second input signal to provide a first output signal and a second output signal having complementary levels at a first output node and a second output node, respectively, using low voltage transistors and high voltage transistors having different characteristics, the first input signal being obtained by inverting an input signal and the second input signal being obtained by inverting the first input signal; and a latch circuit, connected to the shifting circuit at the first output node and the second output node, configured to latch the first output signal and the second output signal, configured to receive a negative voltage having a level smaller than a ground voltage, and configured to drive the second output signal and the first output signal complementarily to either a level of a power supply voltage or a level of the negative voltage, based on voltage levels at the first output node and the second output node, respectively.

Embodiments are also directed to a nonvolatile memory device, including: a memory cell array including a nonvolatile memory cell coupled to a word line and a bit line; a pass transistor configured to transfer a first driving voltage to the word line; and a high voltage switch circuit configured to boost a level of an enable signal to a level of a second driving voltage to provide an output signal to a gate of the pass transistor. The high voltage switch circuit includes: a negative level shifter configured to receive the first driving voltage and a negative voltage having a level lower than a ground voltage, and configured to shift a level of the enable signal to provide a first gate signal and a second gate signal having complementary levels and swinging between the first driving voltage and the negative voltage; and a plurality of transistors connected to a first node, the gate of the pass transistor, and an output terminal to provide the output signal, and configured to drive the output terminal to a level of the second driving voltage or discharge the output terminal to a level of the negative voltage.

Embodiments are also directed to a negative level shifter in a nonvolatile memory device, the negative level shifter including: a shifting circuit configured to shift levels of a first input signal and a second input signal to provide a first output signal and a second output signal having complementary levels at a first output node and a second output node, respectively, using low voltage transistors and high voltage transistors having different characteristics, the first input signal being obtained by inverting an input signal and the second input signal being obtained by inverting the first input signal; and a latch circuit, connected to the shifting circuit at the first output node and the second output node, configured to latch the first output signal and the second output signal, configured to receive a negative voltage having a level smaller than a ground voltage, and configured to drive the second output signal and the first output signal complementary to either a level of a power supply voltage or a level of the negative voltage, based on voltage levels at the first output node and the second output node respectively. The shifting circuit includes: a first low voltage transistor which has a source receiving the first input signal, a gate coupled to the ground voltage, and a drain coupled to a first internal node; a second low voltage transistor which has a source receiving the second input signal, a gate coupled to the ground voltage, and a drain coupled to a second internal node; a first high voltage transistor which has a source coupled to the drain of the first low voltage transistor at the first internal node, a gate coupled to the negative voltage, and a drain coupled to the first output node; and a second high voltage transistor which has a source coupled to the drain of the second low voltage transistor at the second internal node, a gate coupled to the negative voltage, and a drain coupled to the second output node. The power supply voltage is applied to a body of the first high voltage transistor and a body of the second high voltage transistor.

BRIEF DESCRIPTION OF THE DRAWINGS

Features will become apparent to those of skill in the art by describing in detail exemplary embodiments with reference to the attached drawings in which:

FIG. 8 is a timing diagram illustrating an example operation of the high voltage switch circuit of FIG. 7A.

DETAILED DESCRIPTION

Figure 1:
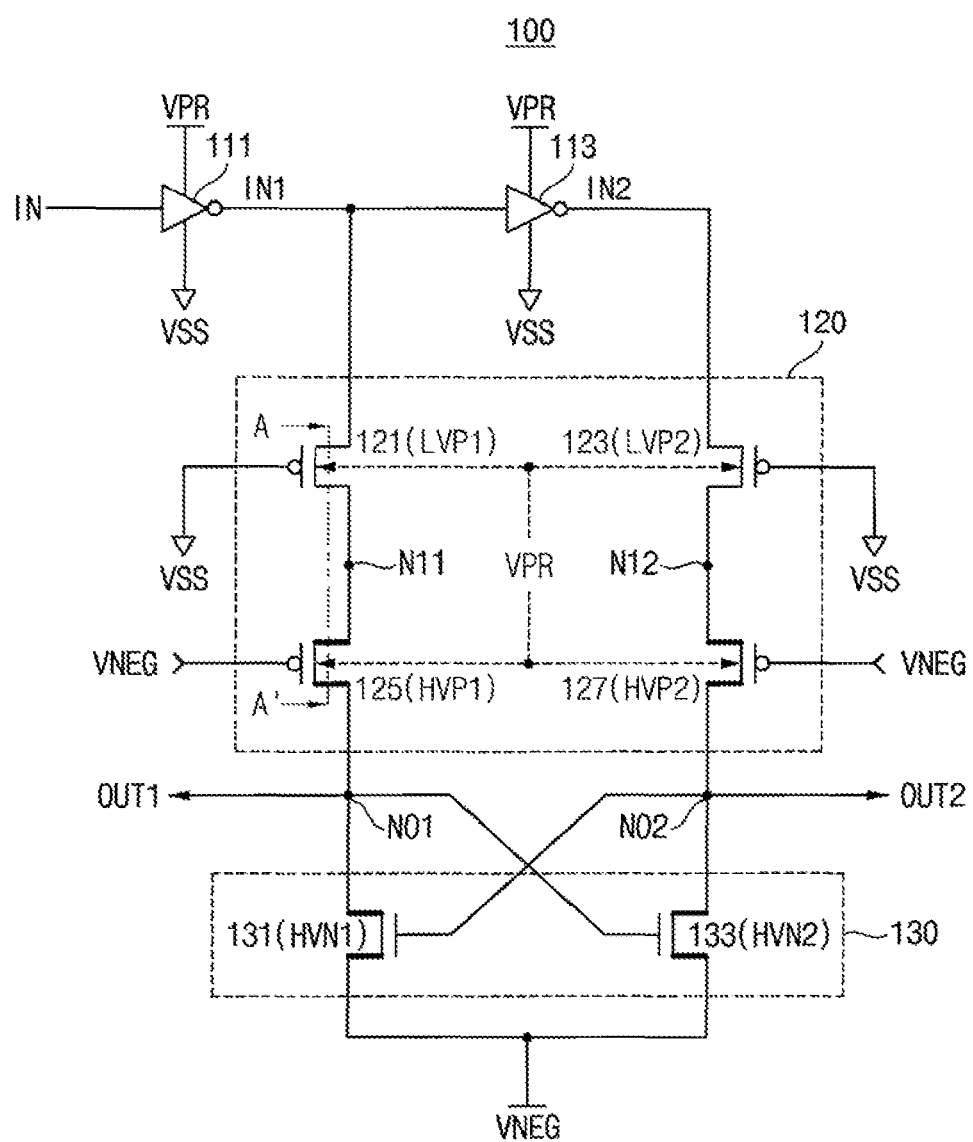
FIG. 1 is a circuit diagram illustrating an example of a negative level shifter according to example embodiments.

FIG. 1 is a circuit diagram illustrating an example of a negative level shifter according to example embodiments.

Referring to FIG. 1, a negative level shifter 100 may include a first inverter 111, a second inverter 113, a shifting circuit 120, and a latch circuit 130.

The first inverter 111 may be connected between a power supply voltage VPR and a ground voltage VSS, and may invert an input signal IN to provide the shifting circuit 120 with a first input signal IN1 swinging between the power supply voltage VPR and the ground voltage VSS. The second inverter 113 may be connected between the power supply voltage VPR and the ground voltage VSS, and may invert the first input signal IN1 to provide the shifting circuit 120 with a second input signal IN2 swinging between the power supply voltage VPR and the ground voltage VSS. The first input signal IN1 and the second input signal IN2 may have complementary levels with respect to each other.

The shifting circuit 120 may shift levels of the first input signal IN1 and the second input signal IN2 to provide a first output signal OUT1 and a second output signal OUT2 having complementary levels at a first output node NO1 and a second output node NO2, respectively, using low voltage transistor and high voltage transistors having different characteristics.

The latch circuit 130 may be connected to the shifting circuit 120 at the first output node NO1 and the second output node NO2, may latch the first output signal OUT1 and the second output signal OUT2, may receive a negative voltage VNEG having a level lower than the ground voltage VSS, and may drive the second output signal OUT2 and the first output signal OUT2 complementarily to either a level of the power supply voltage VPR or a level of the negative voltage VNEG, based on voltage levels at the first output node NO1 and the second output node NO2, respectively.

The shifting circuit 120 may include a first low voltage transistor (LVP1) 121, a second low voltage transistor (LVP2) 123, a first high voltage transistor (HVP1) 125 and a second high voltage transistor (HVP2) 127.

The first low voltage transistor 121 may have a source receiving the first input signal IN1, a gate coupled to the ground voltage VSS, and a drain coupled to a first internal node N11. The second low voltage transistor 123 may have a source receiving the second input signal IN2, a gate coupled to the ground voltage VSS, and a drain coupled to a second internal node IN12. The gates of the first low voltage transistor 121 and the second low voltage transistor 123 may be fixed by being coupled to the ground voltage VSS.

The power supply voltage VPR may be applied to each body of the first low voltage transistor 121 and the second low voltage transistor 123. Each of the first low voltage transistor 121 and the second low voltage transistor 123 may include a low voltage p-channel metal-oxide (PMOS) transistor.

The first high voltage transistor 125 may have a source coupled to the drain of the first low voltage transistor 121 at the first internal node N11, a gate coupled to the negative voltage VNEG, and a drain coupled to the first output node NO1. The second high voltage transistor 127 may have a source coupled to the drain of the second low voltage transistor 123, at the second internal node N12, a gate coupled to the negative voltage VNEG, and a drain coupled to the second output node NO2.

The gates of the first high voltage transistor 125 and the second high voltage transistor 127 may be fixed by being coupled to the negative voltage VNEG, and the first high voltage transistor 125 and the second high voltage transistor 127 may maintain a turned-on state. Since the gates of the first high voltage transistor 125 and the second high voltage transistor 127 are coupled to the negative voltage VNEG, each on resistance of the first high voltage transistor 125 and the second high voltage transistor 127 (in case the first high voltage transistor 125 and the second high voltage transistor 127 are turned-on) may decrease in response to a negative boosting of the negative voltage VNEG.

The power supply voltage VPR may also be applied to each body of the first high voltage transistor 125 and the second high voltage transistor 127. Each of the first high voltage transistor 125 and the second high voltage transistor 127 may include a high voltage PMOS transistor. Each threshold voltage of the first high voltage transistor 125 and the second high voltage transistor 127 may increase in response to the power supply voltage VPR applied to the body of each of the first high voltage transistor 125 and the second high voltage transistor 127. Thus, each threshold voltage of the first high voltage transistor 125 and the second high voltage transistor 127 in case when he power supply voltage VPR is applied to the body of each of the first high voltage transistor 125 and the second high voltage transistor 127 may be higher than each intrinsic threshold voltage of the first high voltage transistor 125 and the second high voltage transistor 127.

The latch circuit 130 may include a first high voltage n-channel metal-oxide semiconductor (NMOS) transistor (HVN1) 131 and a second high voltage NMOS transistor (HVN2) 133.

The first high voltage NMOS transistor 131 may have a drain coupled to the first output node NO1, a gate coupled to the second output node NO2, and a source coupled to the negative voltage VNEG. The second high voltage NMOS transistor 133 may have a drain coupled to the second output node NO2, a gate coupled to the first output node NO1, and a source coupled to the negative voltage VNEG.

The first high voltage NMOS transistor 131 and the second high voltage NMOS transistor 133 are connected in latch configuration, latch the first output signal OUT1 and the second output signal OUT2 at the first output node NO1 and the second output node NO2, respectively, and drive the second output signal OUT2 and the first output signal OUT1 complementarily to either a level of the power supply voltage VPR or a level of the negative voltage VNEG, based on voltage levels at the first output node NO1 and the second output node NO2, respectively.

In another example embodiment (not shown), a plurality of first high voltage NMOS transistors may be connected in series between the first output node NO1 and the negative voltage VNEG, and each gate of the first high voltage NMOS transistors may be coupled to the second node NO2. In addition, a plurality of second high voltage NMOS transistors may be connected in series between the second output node NO2 and the negative voltage VNEG and each gate of the second high voltage NMOS transistors may be coupled to the first node NO1.

When the first input signal IN1 has a level of the power supply voltage VPR, the first low voltage transistor 121 is turned-on and the first output node NO1 has a level of the power supply voltage VPR. When the first input signal IN1 has a level of the power supply voltage VPR, the second input signal IN2 has a level of the ground voltage VSS, the second low voltage transistor 123 is turned-off and the second output node NO2 has an intermediate voltage level that is greater than the negative voltage VNEG and smaller than the ground voltage VSS. Since the first high voltage NMOS transistor 131 is turned-on in response to a voltage level of the second output node NO2, the first output signal OUT1 at the first output node NO1 maintains a level of the power supply voltage VPR.

When the first input signal IN1 has the level of the ground voltage VSS, the first low voltage transistor 121 is turned-off and the first output signal OUT1 at the first output node NO1 has the intermediate voltage level. When the first input signal IN1 has the level of the ground voltage VSS, the second input signal IN2 has the level of the power supply voltage VPR, the second low voltage transistor 123 is turned-on and the second output node NO2 has the level of the power supply voltage VPR. Since the first high voltage NMOS transistor 131 is turned-on in response to a voltage level of the second output node NO2, the first output signal OUT1 at the first output node NO1 is driven (discharged) to a level of the negative voltage VNEG.

Figure 2A:
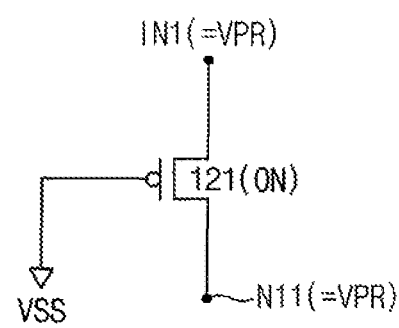
FIGS. 2A and 2B illustrate operation of a first low voltage transistor in response to a first input signal in FIG. 1, respectively.
Figure 2B:
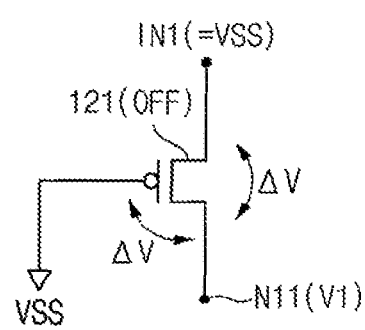

FIGS. 2A and 2B illustrate operation of the first low voltage transistor in response to the first input signal in FIG. 1, respectively.

Referring to FIG. 2A, when first input signal IN1 has the level of the power supply voltage VPR, the first low voltage transistor 121 is turned-on and the first internal node N11 has the level of the power supply voltage VPR.

Referring to FIG. 2B, when the first input signal IN1 has the level of the ground voltage VSS, the drain of the first low voltage transistor 121 has a level of an intermediate voltage V1 due to increased threshold voltage of the first high voltage transistor 125, a voltage difference ΔV between gate-drain of the first low voltage transistor 121 is the same as a voltage difference ΔV between source-drain of the first low voltage transistor 121, and the first low voltage transistor 121 is turned-off. The intermediate voltage V1 may have a voltage level ranging from a negative voltage to a threshold voltage of the first high voltage transistor 125.

The description with reference to FIGS. 2A and 2B may be applied to the second low voltage transistor 123 in FIG. 1.

Figure 3:
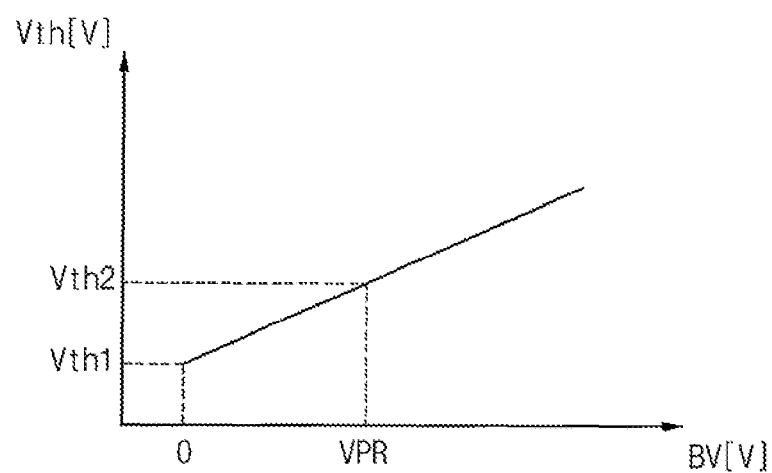
FIG. 3 illustrates variance (change) of a threshold voltage of a high voltage transistor according to a bias voltage applied to a gate of the high voltage transistor in the negative level shifter of FIG. 1.

FIG. 3 illustrates variance (change) of a threshold voltage of a high voltage transistor according to a bias voltage applied to a gate of the high voltage transistor in the negative level shifter of FIG. 1.

Referring to FIG. 3, as a level of the bias voltage BV applied to each body of the first and second high voltage transistors 125 and 127 increases, each threshold voltage Vth of the first and second high voltage transistors 125 and 127 increases from intrinsic threshold voltage Vth1. Since the power supply voltage VPR is applied to each body of the first and second high voltage transistors 125 and 127, each threshold voltage Vth of the first and second high voltage transistors 125 and 127 increases from the intrinsic threshold voltage Vth1 to a threshold voltage Vth2.

Figure 4A:
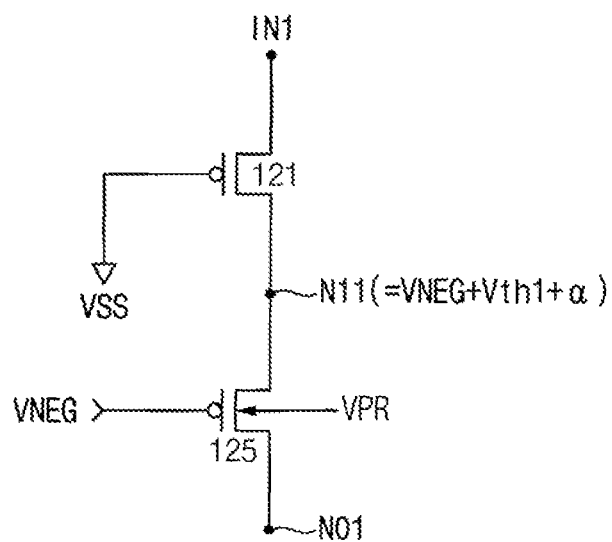
FIG. 4A illustrates a voltage level of a first internal node in the negative level shifter of FIG. 1 according to example embodiments.

FIG. 4A illustrates a voltage level of the first internal node N11 in the negative level shifter of FIG. 1 according to example embodiments.

Referring to FIG. 4A, the negative voltage VNEG is applied to the gate of the first high voltage transistor 125 and the power supply voltage VPR is applied to the body of the first high voltage transistor 125. Therefore, a voltage level of the first internal node N11 may correspond to a sum of the negative voltage VNEG, the intrinsic threshold voltage Vth1 of the first high voltage transistor 125, and an increased amount α of the threshold voltage due to the power supply voltage VPR When the first input signal IN1 having the level of the power supply voltage VPR is applied to the source of the first low voltage transistor 121, the first low voltage transistor 121 is stably turned-on. When the first input signal IN1 having the level of the ground voltage VSS is applied to the source of the first low voltage transistor 121, since a voltage level of the gate of the first low voltage transistor 121 is fixed at a level of the ground voltage VSS and the drain of the first low voltage transistor 121 has a voltage level corresponding to the sum of the negative voltage VNEG, the intrinsic threshold voltage Vth1 of the first high voltage transistor 125, and the increased amount α of the threshold voltage due to the power supply voltage VPR, a voltage level of the first low voltage transistor 121 has a level of the intermediate voltage. Therefore, each of a voltage difference between gate-drain of the first low voltage transistor 121 and a voltage difference between source-drain of the first low voltage transistor 121 may be maintained at about 1[V], and the first low voltage transistor 121 is stably turned-off.

Figure 4B:
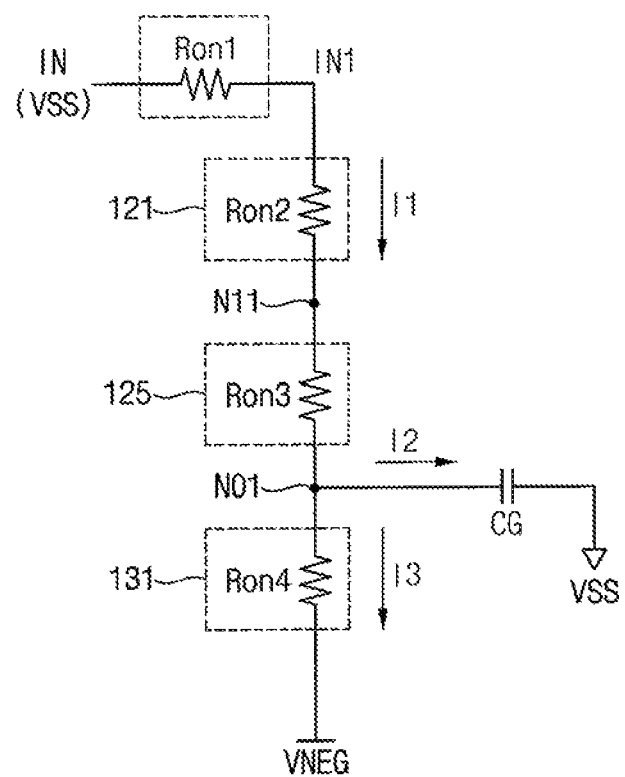
FIG. 4B illustrates a model of transistors in a path through which the first input signal is transferred in the negative level shifter.

FIG. 4B illustrates a model of transistors in a path through which the first input signal is transferred in the negative level shifter.

In FIG. 4B, it is assumed that a PMOS transistor in the first inverter 111 is modeled as on-resistance Ron1, the first low voltage transistor 121 is modeled as on-resistance Ron2, the first high voltage transistor 125 is modeled as on-resistance Ron3, and the first high voltage NMOS transistor 131 is modeled as on-resistance Ron4 when the input signal IN has a level of the ground voltage VSS.

In FIG. 4B, a current I1 denotes a current applied through the first low voltage transistor 121 due to the first input signal IN1, a current I2 denotes a current that charges the first output node NO1, and a current I3 denotes a short current which flows from a time point when the current I1 is initially applied to a time point when a state of the first output node NO1 is changed. In FIG. 4B, a capacitor CG denotes a capacitor of the gate of the first high voltage transistor 125.

In FIG. 4B, since the source of the first high voltage NMOS transistor 131 is coupled to the negative voltage VNEG and the gate of the first high voltage transistor 125 is coupled to the negative voltage VNEG, the on-resistance Ron3 and the on-resistance Ron4 may be varied as a level of the negative voltage VNEG is varies. As the level of the negative voltage VNEG decreases, the on-resistance Ron3 decreases and a voltage variance of the first output node NO1 may be greater than a threshold voltage of the second high voltage NMOS transistor 133. Therefore, the second high voltage NMOS transistor 133 is turned-on in response to the voltage variance of the first output node NO1, and the second output node NO2 is discharged to a level of the ground voltage VSS.

Figure 5:
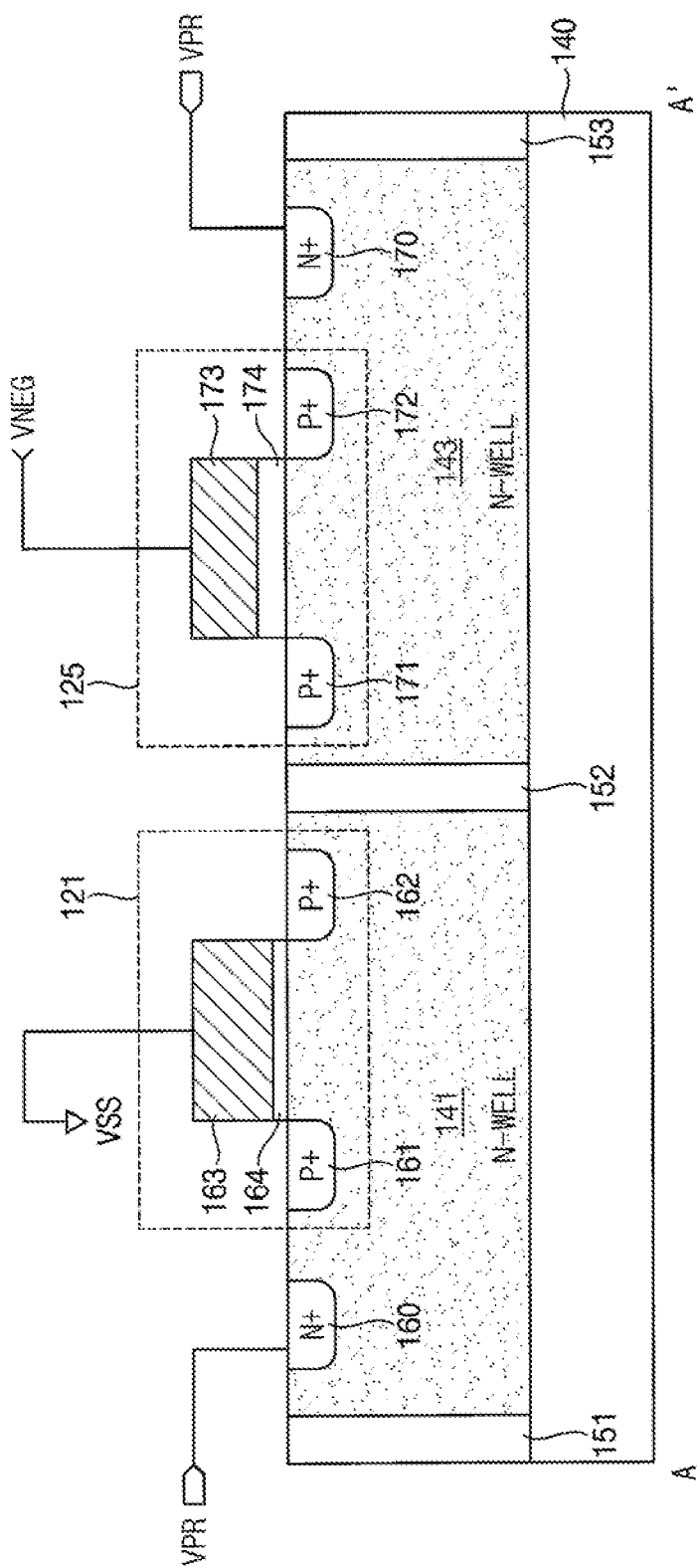
FIG. 5 is a cross sectional view of an inverter taken along a line A-A' in the negative level shifter of FIG. 1 according to example embodiments.

FIG. 5 is a cross sectional view of an inverter taken along a line A-A' in the negative level shifter of FIG. 1 according to example embodiments.

Referring to FIG. 5, isolation regions 151, 152, and 153 are formed in a semiconductor substrate 140, and N-wells 141 and 143 are formed in regions between the isolation regions 151, 152, and 153.

N-type doping regions 160 and 170 are formed in the N-wells 141 and 143, respectively. P-type doping regions 161 and 162 are formed in the N-well 141. P-type doping regions 171 and 172 are formed in the N-well 143. A gate oxide 164 and a gate electrode 163 are formed between the p-type doping regions 161 and 162. A gate oxide 174 and a gate electrode 173 are formed between the p-type doping regions 171 and 172.

The p-type doping regions 161 and 162, the gate oxide 164, and the gate electrode 163 correspond to the first low voltage transistor 121. The p-type doping regions 171 and 172, the gate oxide 174, and the gate electrode 173 correspond to the first high voltage transistor 125.

The power supply voltage VPR is applied to the n-type doping region 160 and thus the body of the first low voltage transistor 121 is biased with the power supply voltage VPR. The power supply voltage VPR is also applied to the n-type doping region 170 and thus the body of the first high voltage transistor 125 is also biased with the power supply voltage VPR. The ground voltage VSS is applied to the gate electrode 163 and thus the gate of the first low voltage transistor 121 is fixed with the ground voltage VSS. The negative voltage VNEG is applied to the gate electrode 173 and thus the gate of the first high voltage transistor 125 is fixed with the negative voltage VNEG.

A first thickness of a gate dielectric of the first low voltage transistor 121 may be smaller than a second thickness of a gate dielectric the first high voltage transistor 125. For example, the first low voltage transistor 121 may have a gate dielectric layer having a first thickness, the first high voltage transistor may have a gate dielectric layer having a second thickness, and the first thickness may be less than the second thickness. For example, a first thickness of the gate oxide 164 of the first low voltage transistor 121 may be smaller than a second thickness of the gate oxide 174 of the first high voltage transistor 125.

Descriptions with reference to FIG. 5 may be similarly applied to the second low voltage transistor 123 and the second high voltage transistor 127 in FIG. 1. Therefore, a first thickness of a gate dielectric of the second low voltage transistor 123 may be smaller than a second thickness of a gate dielectric of the second high voltage transistor 127.

Characteristic of the transistors may include channel length, thickness of a gate dielectric, and current-voltage response of each of the transistors.

Figure 6:
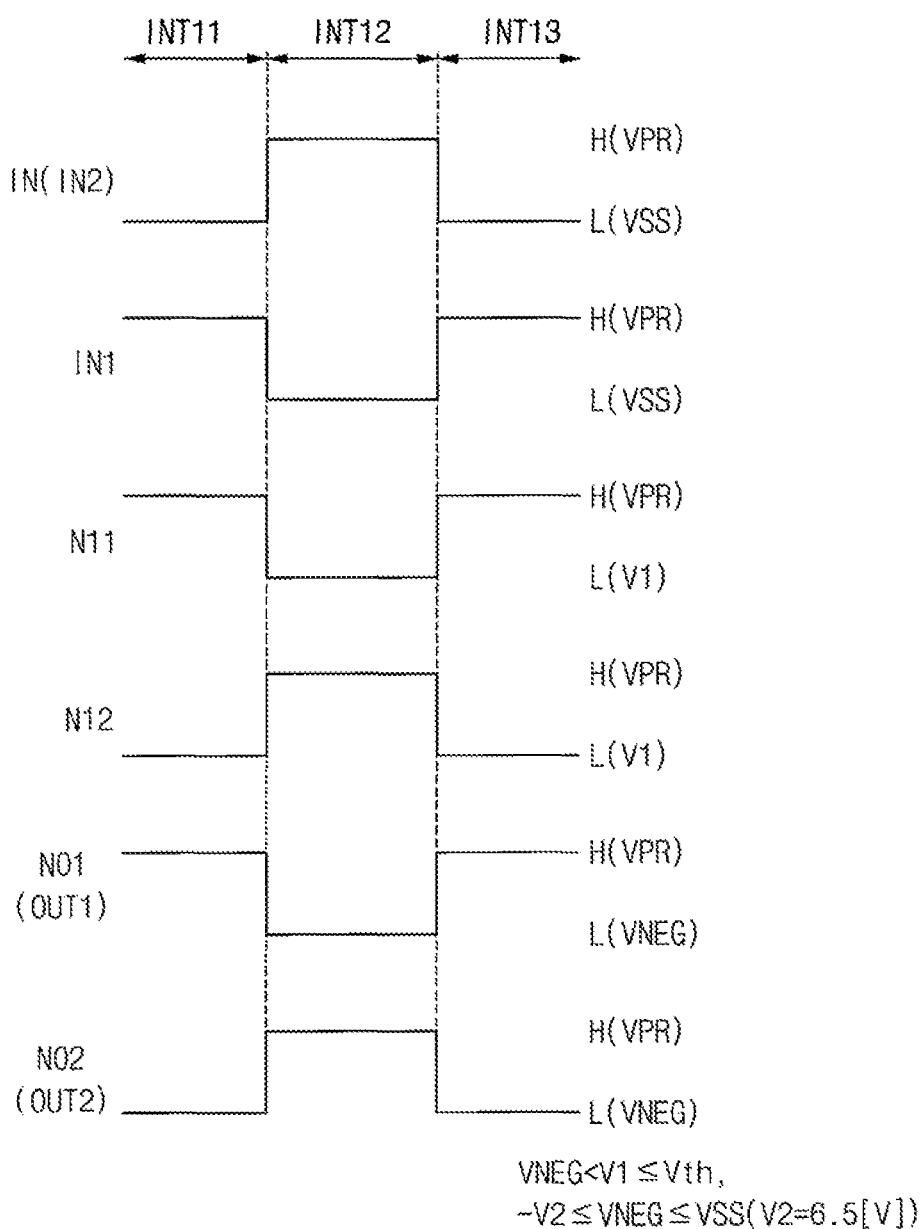
FIG. 6 is a timing diagram illustrating an example operation of the negative level shifter of FIG. 1.

FIG. 6 is a timing diagram illustrating an example operation of the negative level shifter of FIG. 1, for first through third intervals.

In FIG. 6, the input signal IN and the second input signal IN2 have the same voltage levels.

First Interval INT11

Referring to FIGS. 1 through 4B and 6, during a first interval INT11, the second input signal IN2 has a low level L and the first input signal IN1 has a high level H. The first low voltage transistor 121 is turned-on in response to the first input signal IN1 having a high level, and a voltage level of the first internal node N11 has a high level. The second low voltage transistor 123 is turned-off in response to the second input signal IN2 having a low level, and the second internal node N12 has a level of the intermediate voltage V1. The level of the intermediate voltage V1 ranges from the negative voltage VNEG to a threshold voltage Vth of the first high voltage transistor 125. The intermediate voltage V1 is greater than the negative voltage VNEG, and is equal to or smaller than the threshold voltage Vth of the first high voltage transistor 125.

The first output node NO1 has a high level in response to the first internal node N11 having a high level, the second high voltage NMOS transistor 133 is turned-on in response to the first output node NO1 having a high level, and the second output node NO2 is discharged to a level of the ground voltage VSS. The second output node NO2 transits to a negative voltage in response to the second internal node N12 having a negative voltage, the first high voltage NMOS transistor 131 is turned-off in response to the second output node NO2 having a negative level, and the first output node NO1 is maintained at a high level.

Second Interval INT12

Operation of the negative level shifter 100 during a second interval INT12 may be complementary with the operation the negative level shifter 100 during the first interval INT11.

During the second interval INT12, the second output node NO2 transits to a high level in response to the second internal node N12 having a high level, the first high voltage NMOS transistor 131 is turned-on in response to the second output node NO2 having a high level, and the first output node NO1 is discharged to a level of the negative voltage VNEG. The first output node NO1 transits to a negative level in response to the first internal node N11 having a negative level, the second high voltage NMOS transistor 133 is turned-off in response to the first output node NO1 having a negative level, and the second output node NO2 is maintained at to a high level.

Third interval INT13

Operation of the negative level shifter 100 during a third interval INT13 may be the same as the operation of the negative level shifter 100 during the first interval INT11.

In FIG. 6, the high level H corresponds to a level of the power supply voltage VPR. The low level of each of the input signal IN, the first input signal IN1, and the second input signal IN2 corresponds to a level of the ground voltage VSS. A low level of each of the first internal node N11 and the second internal node N12 corresponds to a level of the intermediate voltage V1. A low level of each of the first output node NO1 and the second output node NO2 corresponds to a level of the negative voltage VNEG.

The negative voltage VNEG may be greater than −V2 and may be equal to or smaller than the ground voltage VSS. V2 may correspond to about 6.5[V].

The negative level shifter 100 includes low voltage transistors and high voltage transistors having different characteristic, and thus may provide enhanced reliability margin under voltage equal to or smaller than the negative voltage and may provide enhanced on-off characteristic by turning-on the high voltage transistors by coupling the gates of the high voltage transistors to the negative voltage.

Figure 7A:
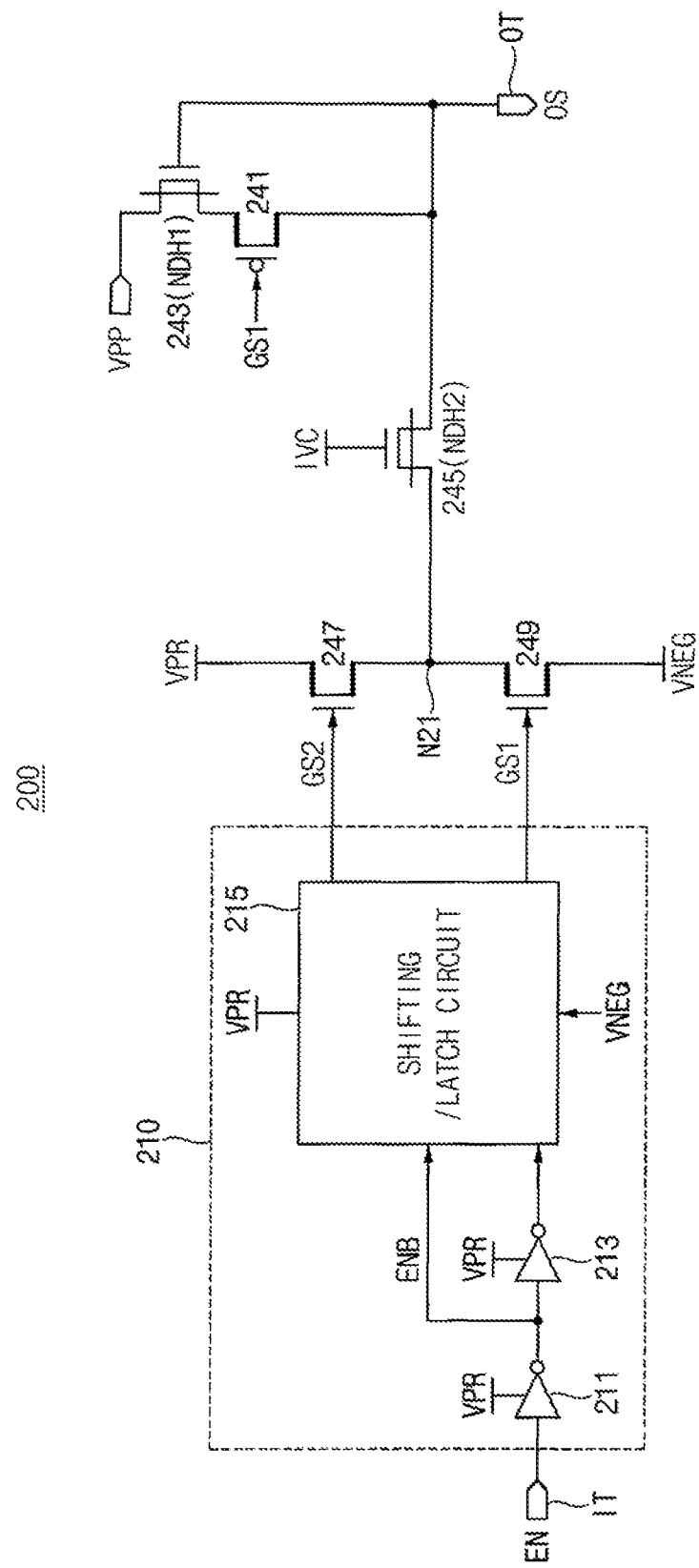
FIG. 7A is a circuit diagram illustrating a high voltage switch circuit according to example embodiments.

FIG. 7A is a circuit diagram illustrating a high voltage switch circuit according to example embodiments.

Referring to FIG. 7A, a high voltage switch circuit 200 may include a negative level shifter 210, a first transistor 241, a first depletion mode transistor (NDH1) 243, a second depletion mode transistor (NDH2) 245, a second transistor 247, and a third transistor 249. The high voltage switch circuit 200 may further include an input terminal IT and an output terminal OT. The first transistor 241, the second transistor 247, and the third transistor 249 may be referred to as a plurality of transistors.

The high voltage switch circuit 200 may be included in a nonvolatile memory device (for example, a nonvolatile memory device 400 of FIG. 10), and may operate based on a first driving voltage VPR, a second driving voltage VPP having a voltage level greater than the first driving voltage VPR, and a negative voltage VNEG having a voltage level equal to or less than the ground voltage VSS. The high voltage switch circuit 200 may receive the second driving voltage VPP, which is a high voltage, may shift a level of an input signal (for example, an enable signal EN) based on the first driving voltage VPR, which is a low voltage, and may convert the input signal to an output signal OS swinging between the second driving voltage VPP and the negative voltage VNEG.

The first driving voltage VPR may be associated with driving the nonvolatile memory device 400 and may have a level of about 2.5 [V]. The second driving voltage VPP may be associated with driving the nonvolatile memory device 400 and may have a level greater than 20[V] (for example, about 28.5[V]). The negative voltage VNEG may be associated with driving the nonvolatile memory device 400 and may have a level from −4[V] to −6.5[V].

The first transistor 241 transfers the second driving voltage VPP to the output terminal OT in response to a first gate signal GS1 applied to a gate of the first transistor 241. The first transistor 241 may include a high voltage PMOS transistor.

The first depletion mode transistor 243 transfers the second driving voltage VPP to the first transistor 241 in response to the output signal OS applied to a gate of the first depletion mode transistor 243. The output signal OS is fed-back from the output terminal OT. The first depletion mode transistor 243 may include a high voltage n-type depletion mode transistor having a threshold voltage of Vth3.

The first transistor 241 and the first depletion mode transistor 243 may form or constitute a feedback structure to provide the output signal OS. For example, the second driving voltage VPP may be provided to a first electrode (e.g., a drain (electrode)) of the first depletion mode transistor 243. When the enable signal EN is activated, the first transistor 241 may be turned on in response to the first gate signal GS1.

At an initial operation time, a voltage level of the output signal OS may have a level of the negative voltage VNEG immediately after the enable signal EN is activated, and thus a voltage at the gate of the first depletion mode transistor 243 may also be substantially the same as the negative voltage VNEG. A voltage at a first electrode (e.g., a source (electrode)) of the first transistor 241 may increase to the threshold voltage Vth3 of the first depletion mode transistor 243. Thus, the output signal OS may become the threshold voltage Vth3 of the first depletion mode transistor 243. The output signal OS may be fed back to the gate electrode of the first depletion mode transistor 243. The voltage at the first electrode of the first transistor PM1 may increase to a sum of the output signal OS and the threshold voltage Vth3 of the first depletion mode transistor 243. By repeating those processes, the output signal OS may increase to the level of the second driving voltage VPP.

The negative level shifter 210 may shift a level of the enable signal EN to provide the first gate signal GS1 and a second gate signal GS2 having complementary levels and swinging between the first driving voltage VPR and the negative voltage VNEG based on the first driving voltage VPR and the negative voltage VNEG. A high level of the enable signal EN received at the input terminal IT may be substantially the same as a level of the first driving voltage VPR.

The negative level shifter 210 may include a first inverter 211, a second inverter 213, and shifting/latch circuit 215.

The first inverter 211 operates based on receiving the first driving voltage VPR and inverts the enable signal EN to output an inverted enable signal ENB. The second inverter 213 operates based on receiving the first driving voltage VPR and inverts the inverted enable signal ENB to output a signal which is substantially the same as the enable signal EN. A high level of the inverted enable signal ENB may be substantially the same a level of the first driving voltage VPR.

The shifting/latch circuit 215 operates based on receiving the first driving voltage VPR and the negative voltage VNEG, and may shift levels of the enable signal EN and the inverted enable signal ENB to generate the first gate signal GS1 and the second gate signal GS2 which have complementary voltage levels with respect to each other.

The shifting/latch circuit 215 may include the shifting circuit 120 and the latch circuit 130 in the negative level shifter 100 of FIG. 1.

The second transistor 247 may be coupled to the first driving voltage VPR and a first node N21, and may drive the first node N21 to a level of the first driving voltage VPR in response to the first gate signal GS1. The second transistor 247 may include a high voltage PMOS transistor which has a source receiving the first driving voltage VPR, a gate receiving the first gate signal GS1, and a drain coupled to the first node N21.

The third transistor 249 may be coupled to the first node N21 and the negative voltage VNEG, and may discharge the first node N21 to a level of the negative voltage VNEG in response to the second gate signal GS2. The third transistor 249 may include a high voltage PMOS transistor which has a source coupled to the first node N21, a gate receiving the second gate signal GS2, and a drain coupled to the negative voltage VNEG.

The second depletion mode transistor 245 may couple the first node N21 to the output node OT in response to an internal power supply voltage IVC. The second depletion mode transistor 245 may be coupled between the output terminal OT and the first node N21, and may have a gate coupled to the internal power supply voltage IVC.

When the first gate signal GS1 has a level of the negative voltage VNEG, the second gate signal GS2 has a level of the first driving voltage VPR. Therefore, the first transistor 241 is turned-on, the second transistor 247 is turned-on, and the third transistor 249 is turned-off. The second transistor 247 drives the first node N21 to a level of the first driving voltage VPR and the output terminal OT is driven to a level of the first driving voltage VPR when the second depletion mode transistor 245 connects the first node N21 to the output terminal OT. The first depletion mode transistor 243 is turned-on in response to the first driving voltage VPR at the output terminal OT, the second driving voltage VPP is transferred to the output terminal OT, and the output terminal OT is driven to a level of the second driving voltage VPP.

When the first gate signal GS1 has a level of the first driving voltage VPR, the second gate signal GS2 has a level of the negative voltage VNEG. Therefore, the first transistor 241 is turned-off, the second transistor 247 is turned-off, and the third transistor 249 is turned-on. The third transistor 249 drives the first node N21 to a level of the negative voltage VNEG and the output terminal OT is driven to a level of the negative voltage VNEG when the second depletion mode transistor 245 connects the first node N21 to the output terminal OT.

Figure 7B:
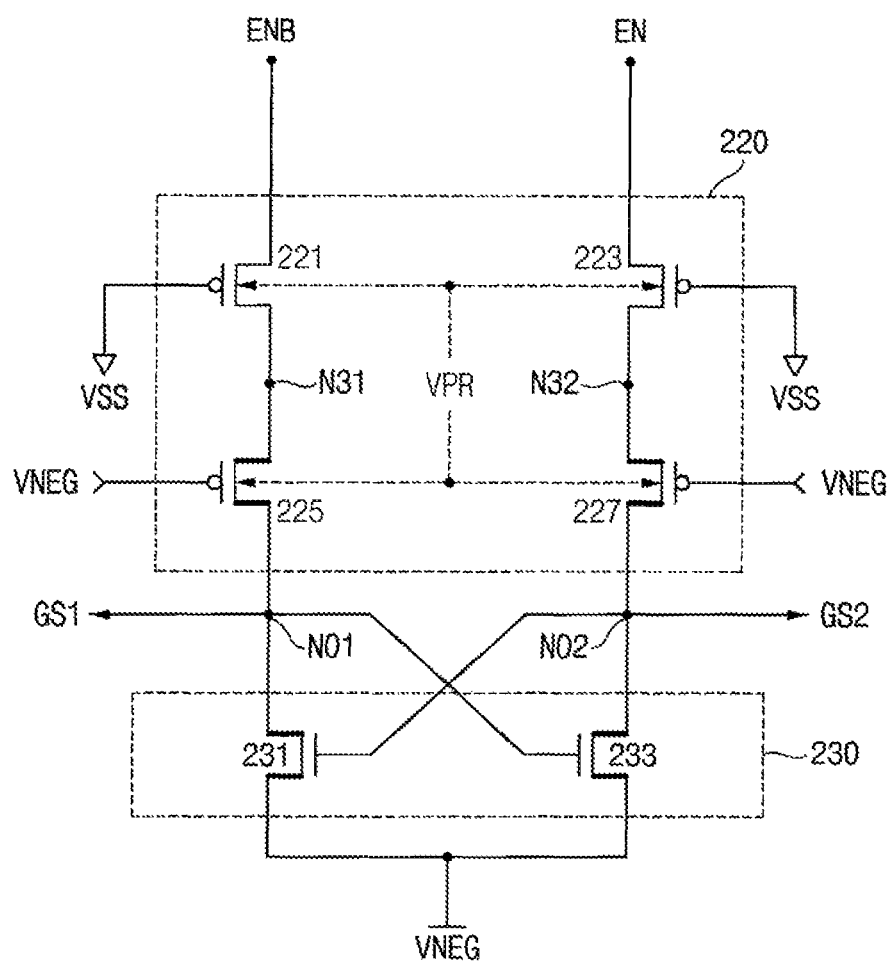
FIG. 7B is a circuit diagram illustrating a shifting/latch circuit in the high voltage switch circuit of FIG. 7A according to example embodiments.

FIG. 7B is a circuit diagram illustrating the shifting/latch circuit in the high voltage switch circuit of FIG. 7A according to example embodiments.

Referring to FIG. 7B, the shifting/latch circuit may include a shifting circuit 220 and a latch circuit 230.

The shifting circuit 220 may shift levels of the inverted enable signal ENB and the enable signal EN to provide the first gate signal GS1 and the second gate signal GS2 having complementary levels at a first output node NO1 and a second output node NO2, respectively, using low voltage transistor and high voltage transistors having different characteristics.

The shifting circuit 220 may include a first low voltage transistor 221, a second low voltage transistor 223, a first high voltage transistor 225, and a second high voltage transistor 227. The gates of the first low voltage transistor 221 and the second low voltage transistor 223 may be fixed by being coupled to the ground voltage VSS. In addition, the power supply voltage (the first driving voltage) VPR may be applied to each body of the first low voltage transistor 221 and the second low voltage transistor 223.

The gates of the first high voltage transistor 225 and the second high voltage transistor 227 may be fixed by being coupled to the negative voltage VNEG, and the first high voltage transistor 225 and the second high voltage transistor 227 may maintain turned-on state. In addition, the power supply voltage (the first driving voltage) VPR may be applied to each body of the first high voltage transistor 225 and the second high voltage transistor 227.

The latch circuit 230 may include a first high voltage NMOS transistor 231 and a second high voltage NMOS transistor 233.

Configuration and operation of the shifting circuit 220 and the latch circuit 290 may be substantially the same as configuration and operation of the shifting circuit 220 and the latch circuit 290 in FIG. 1. Thus, the negative level shifter 210 in FIG. 7A may shift a level of the enable signal EN to provide the first gate signal GS1 and the second gate signal GS2 having complementary levels and swinging between the first driving voltage VPR and the negative voltage VNEG.

FIG. 8 is a timing diagram illustrating an example operation of the high voltage switch circuit of FIG. 7A, for first through third intervals.

First Interval INT21

Referring to FIGS. 7A through 8, during a first interval INT21, the enable signal EN has a low level L and the inverted enable signal ENB has a high level. As described with reference to FIG. 6, the negative level shifter 210 may provide the first gate signal GS1 having a level of the first driving voltage VPR and the second gate signal GS2 having a level of the negative voltage VNEG at the first output node NO1 and the second output node NO2, respectively. The third transistor 249 is turned-on in response to the first gate signal GS1 having a level of the first driving voltage VPR, and the first node N21 is discharged to a level of the negative voltage VNEG. In addition, the third transistor 249 is turned-off in response to the first gate signal GS1 having a level of the negative voltage VNEG, and the output signal OS at the output terminal OT has a level of the negative voltage VNEG.

Second Interval INT22

Operation of the high voltage switch circuit 200 during a second interval INT22 may be complementary with the high voltage switch circuit 200 during a first interval INT21. During the second interval INT22, the enable signal EN has a high level H and the inverted enable signal ENB has a low level. As described with reference to FIG. 6, the negative level shifter 210 may provide the first gate signal GS1 having a level of the negative voltage VNEG and the second gate signal GS2 having a level of the first driving voltage VPR at the first output node NO1 and the second output node NO2, respectively. The second transistor 247 is turned-on in response to the second gate signal GS2 having a level of the first driving voltage VPR, and the first node N21 is driven to a level of the first driving voltage VPR. In addition, the first transistor 241 is turned-on in response to the first gate signal GS1 having a level of the first driving voltage VPR, and the output signal OS at the output terminal OT is shifted to a level of the first driving voltage VPR.

Third Interval INT23

Operation of the high voltage switch circuit 200 during a third interval INT23 may be the same as the operation of the high voltage switch circuit 200 during the first interval INT21.

The high voltage switch circuit 200 may include low voltage transistors and high voltage transistors having different characteristic, and thus may provide enhanced reliability margin under voltage equal to or smaller than the negative voltage and may enhance performance by including the negative level shifter which reduces on-resistance by turning-on the high voltage transistors by coupling the gates of the high voltage transistors to the negative voltage.

In FIG. 8, a level of the first driving voltage VPR is smaller than a level of the second driving voltage VPP, the level of the first driving voltage VPR is greater than the ground voltage VSS, and the negative voltage VNEG is equal to or smaller than the ground voltage VSS.

Figure 9:
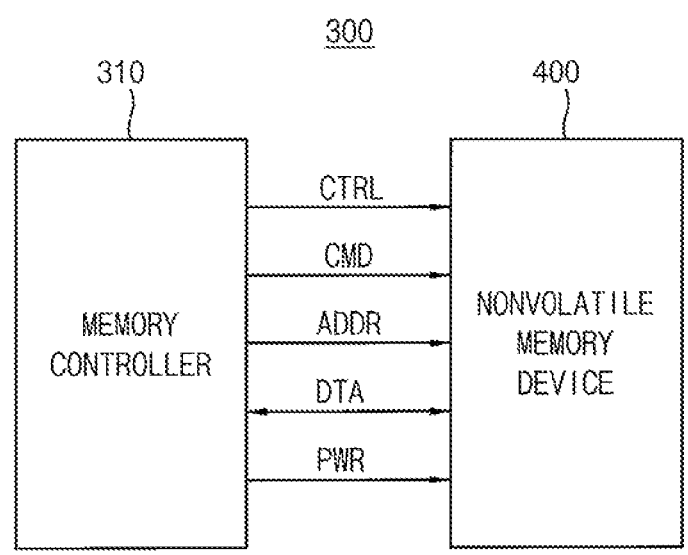
FIG. 9 is a block diagram illustrating a memory system that employs a high voltage switch circuit according to example embodiments.

FIG. 9 is a block diagram illustrating a memory system that employs a high voltage switch circuit according to example embodiments.

Referring to FIG. 9, a memory system 300 may include a memory controller 310 and a nonvolatile memory device 400. The nonvolatile memory device 400 may perform an erase operation, a program operation, or a write operation under control of the memory controller 310. The nonvolatile memory device 400 may receive a command CMD, an address ADDR, and data DTA through input/output lines from the memory controller 310 for performing such operations. In addition, the nonvolatile memory device 400 may receive a control signal CTRL through a control line and receive a power PWR through a power line from the memory controller 310.

Figure 10:
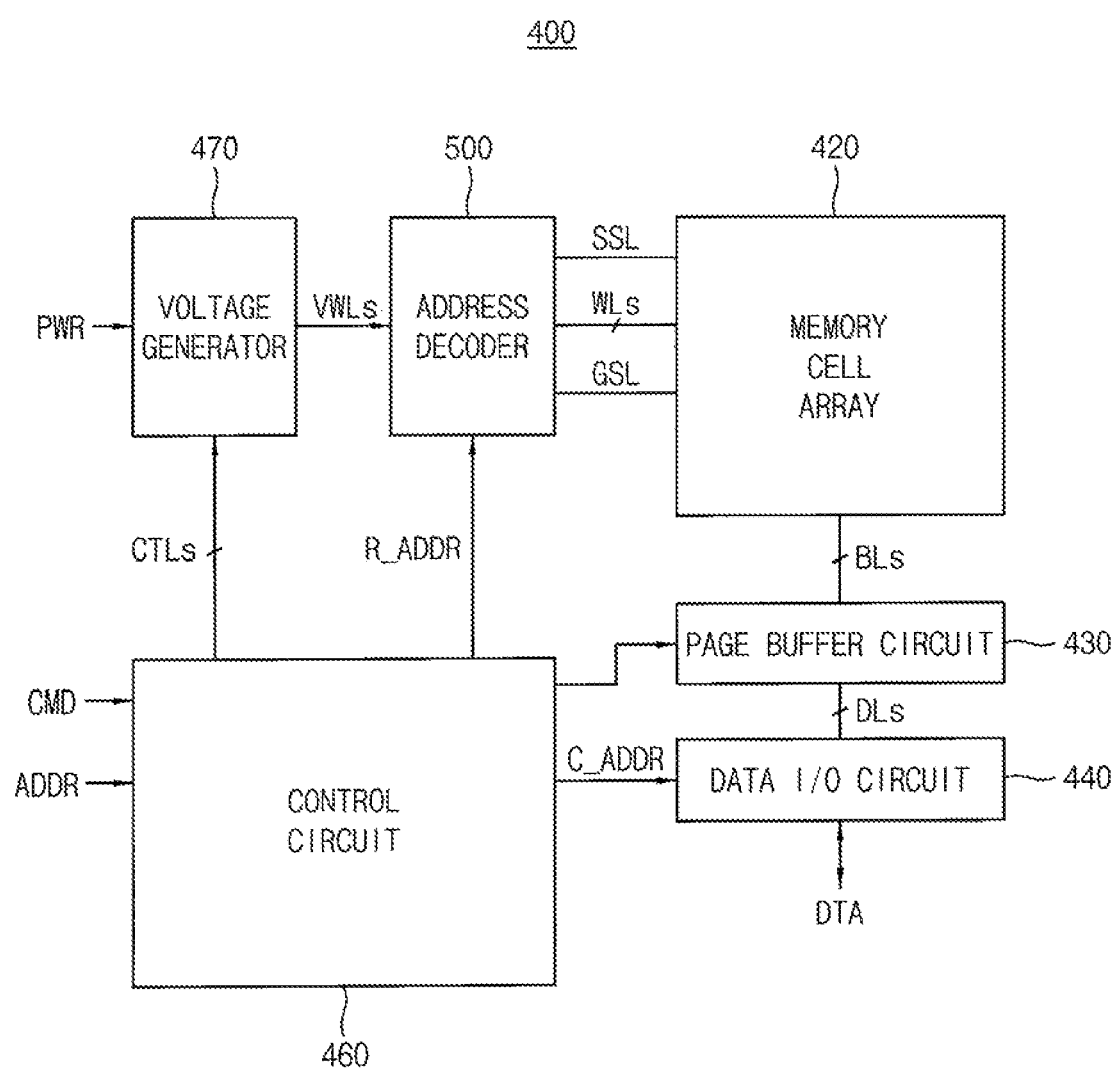
FIG. 10 is a block diagram illustrating the nonvolatile memory device in FIG. 9 according to example embodiments.

FIG. 10 is a block diagram illustrating the nonvolatile memory device in FIG. 9 according to example embodiments.

Referring to FIG. 10, the nonvolatile memory device 400 may include a memory cell array 420, an address decoder 500, a page buffer circuit 430, a data input/output circuit 440, a control circuit 460, and a voltage generator 470.

The memory cell array 420 may be coupled to the address decoder 500 through a string selection line SSL, a plurality of word lines WLs, and a ground selection line GSL. In addition, the memory cell array 420 may be coupled to the page buffer circuit 430 through a plurality of bit lines BLs. The memory cell array 420 may include a plurality of memory cells coupled to the plurality of word lines WLs and the plurality of bit lines BLs.

In some example embodiments, the memory cell array 420 may be a three-dimensional memory cell array, which is formed on a substrate in a three-dimensional structure (or a vertical structure). In this case, the memory cell array 420 may include vertical cell strings that are vertically oriented such that at least one memory cell is located over another memory cell. In other example embodiments, the memory cell array 420 may be a two-dimensional memory cell array, which is formed on a substrate in a two-dimensional structure (or a horizontal structure).

Figure 11:
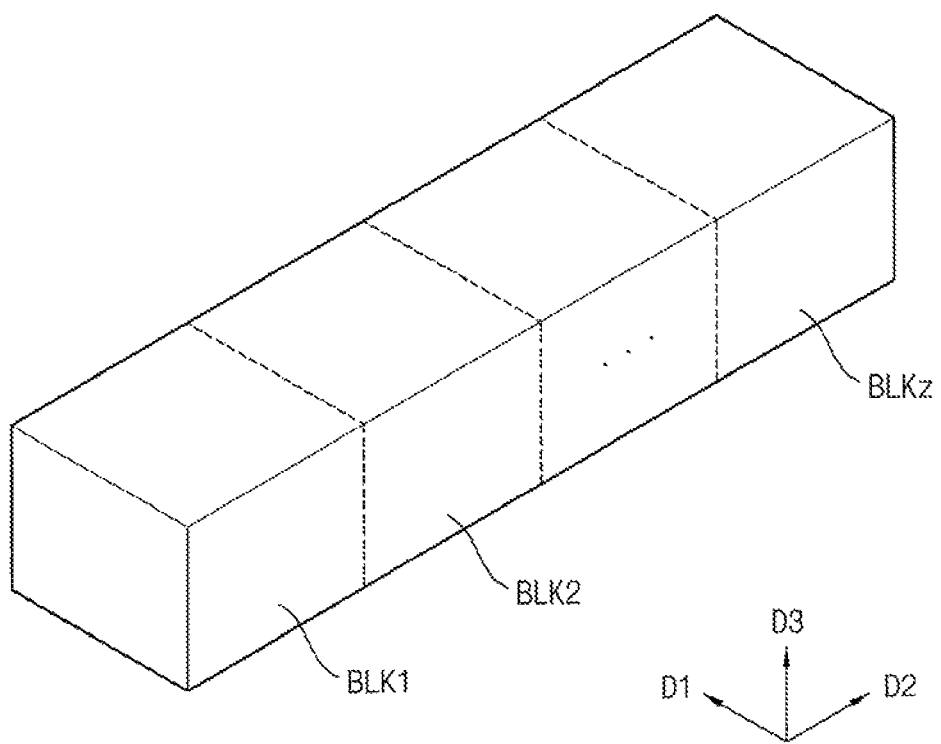
FIG. 11 is a block diagram illustrating the memory cell array in the nonvolatile memory device of FIG. 10.

FIG. 11 is a block diagram illustrating the memory cell array in the nonvolatile memory device of FIG. 10.

Referring to FIG. 11, the memory cell array 420 may include a plurality of memory blocks BLK1 to BLKz. The memory blocks BLK1 to BLKz may extend along first through third directions D1, D2 and D3. In an embodiment, the memory blocks BLK1 to BLKz are selected by the address decoder 500 in FIG. 10. For example, the address decoder 500 may select a memory block BLK corresponding to a block address among the memory blocks BLK1 to BLKz.

Figure 12:
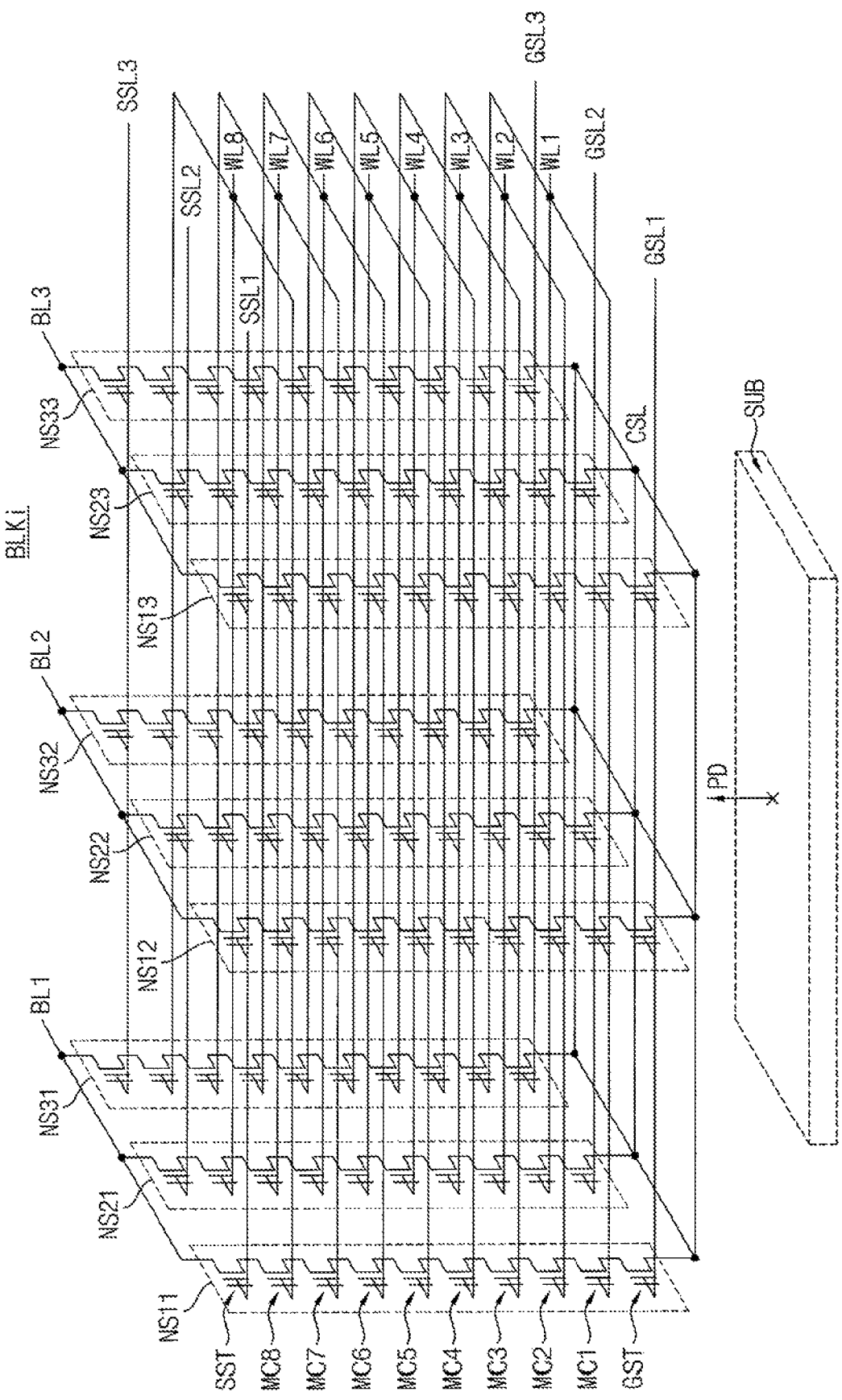
FIG. 12 is a circuit diagram illustrating a memory block of FIG. 11.

FIG. 12 is a circuit diagram illustrating one of the memory blocks of FIG. 11.

The memory block BLKi of FIG. 12 may be formed on a substrate SUB in a three-dimensional structure (or a vertical structure). For example, a plurality of memory cell strings included in a memory block BLKb may be formed in a direction PD perpendicular to the substrate SUB.

Figure 16:
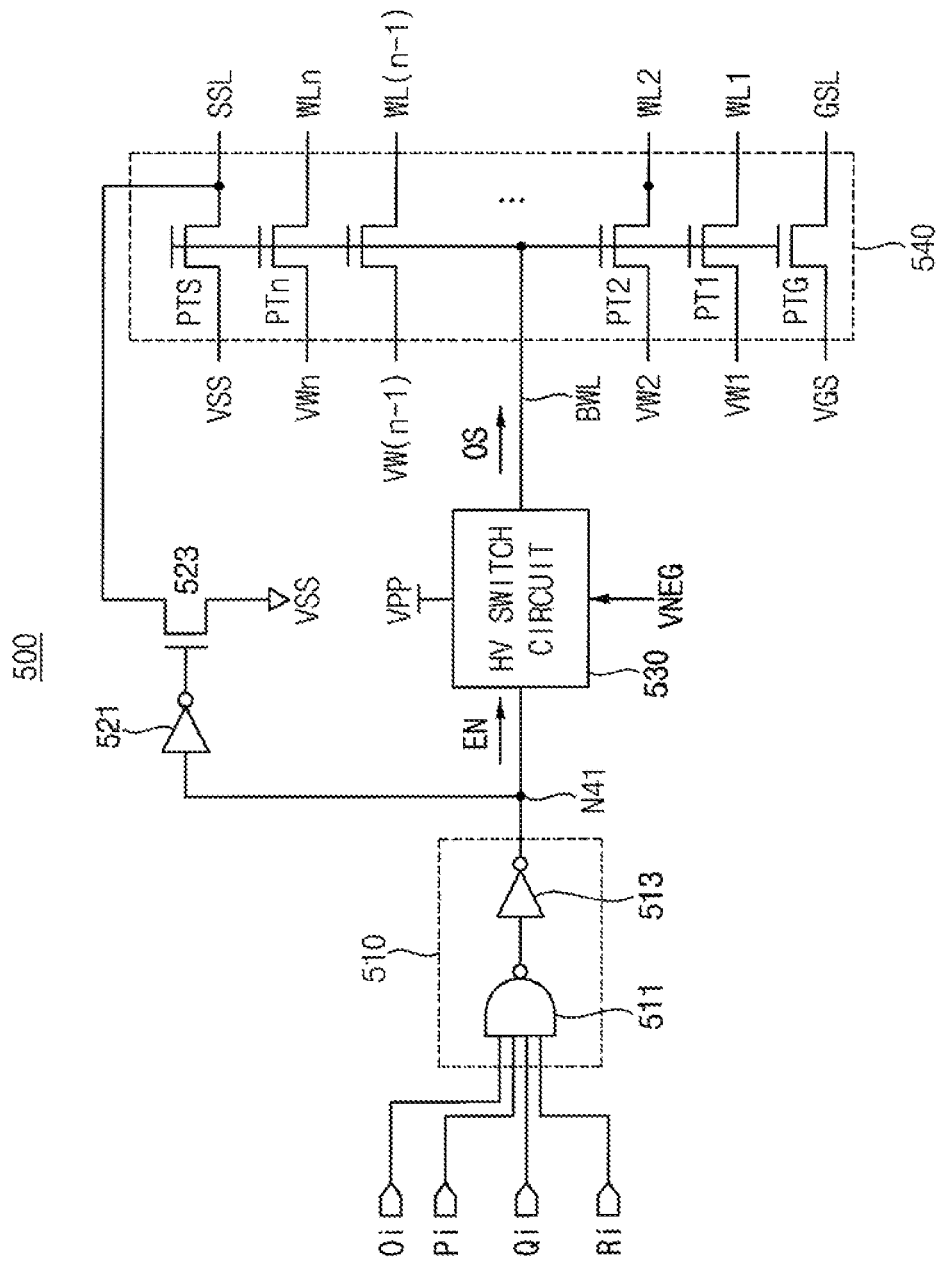
FIG. 16 is a circuit diagram illustrating an example of an address decoder in the nonvolatile memory device of FIG. 10 according to example embodiments.

Referring to FIG. 12, the memory block BLKi may include memory cell strings NS11 to NS33 coupled between bit lines BL1, BL2, and BL3 and a common source line CSL. Each of the memory cell strings NS11 to NS33 may include a string selection transistor SST, a plurality of memory cells MC1 to MC8, and a ground selection transistor GST. In FIG. 16, each of the memory cell strings NS11 to NS33 is illustrated to include eight memory cells MC1 to MC8. However, example embodiments are not limited thereto. In some example embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word lines WL1 to WL8, respectively. The ground selection transistor GST may be connected to corresponding ground selection lines GSL1 to GSL3. The string selection transistor SST may be connected to corresponding bit lines BL1, BL2, and BL3, and the ground selection transistor GST may be connected to the common source line CSL.

Word lines (e.g., WL1) having the same height may be commonly connected, and the ground selection lines GSL1 to GSL3 and the string selection lines SSL1 to SSL3 may be separated. In FIG. 12, the memory block BLKi is illustrated to be coupled to eight word lines WL1 to WL8 and three bit lines BL1 to BL3. However, example embodiments are not limited thereto. In some example embodiments, the memory cell array 420 may be coupled to any number of word lines and bit lines.

Figure 13:
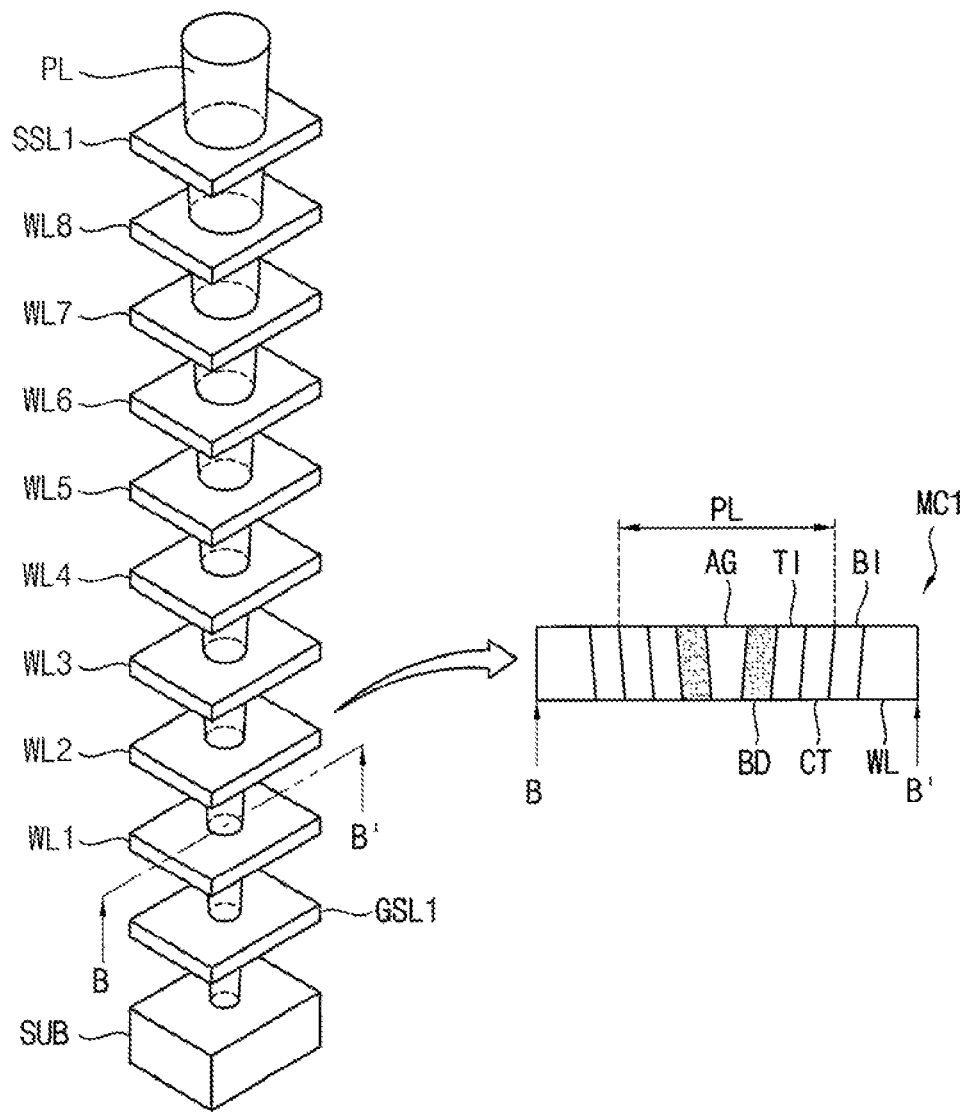
FIG. 13 illustrates an example of a structure of a cell string CS in the memory block of FIG. 12.

FIG. 13 illustrates an example of a structure of a cell string CS in the memory block of FIG. 12.

Referring to FIGS. 12 and 13, a pillar PL is provided on the substrate SUB such that the pillar PL extends in a direction perpendicular to the substrate SUB and contacts the substrate SUB. Each of the ground selection line GSL, the word lines WL1 to WL8, and the string selection lines SSL illustrated in FIG. 13 may be formed of a conductive material parallel with the substrate SUB, for example, a metallic material. The pillar PL may be in contact with the substrate SUB through the conductive materials forming the string selection lines SSL, the word lines WL1 to WL8, and the ground selection line GSL.

A sectional view taken along a line B-B' is also illustrated in FIG. 13. In an example embodiment, a sectional view of a first memory cell MC1 corresponding to a first word line WL1 is illustrated. The pillar PL may include a cylindrical body BD. An air gap AG may be defined in the interior of the body BD.

The body BD may include P-type silicon, and may be an area where a channel will be formed. The pillar PL may further include a cylindrical tunnel insulating layer TI surrounding the body BD, and a cylindrical charge trap layer CT surrounding the tunnel insulating layer TI. A blocking insulating layer BI may be provided between the first word line WL and the pillar PL. The body BD, the tunnel insulating layer TI, the charge trap layer CT, the blocking insulating layer BI, and the first word line WL may constitute a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

Referring back to FIG. 10, the control circuit 460 may receive the command (signal) CMD and the address (signal) ADDR from the memory controller 310 and control an erase loop, a program loop, and a read operation of the nonvolatile memory device 400 based on the command signal CMD and the address signal ADDR. The program loop may include a program operation and a program verification operation. The erase loop may include an erase operation and an erase verification operation.

For example, the control circuit 460 may generate control signals CTLs, which are used for controlling the voltage generator 470, based on the command signal CMD, and generate a row address R_ADDR and a column address C_ADDR based on the address signal ADDR. The control circuit 460 may provide the row address R_ADDR to the address decoder 500, and provide the column address C_ADDR to the data input/output circuit 440.

The address decoder 500 may be coupled to the memory cell array 420 through the string selection line SSL, the plurality of word lines WLs, and the ground selection line GSL. During the program operation or the read operation, the address decoder 500 may determine one of the plurality of word lines WLs as a first word line (i.e., a selected word line) and determine rest of the plurality of word lines WLs except for the first word line as unselected word lines based on the row address R_ADDR.

The voltage generator 470 may generate word line voltages VWLs, which are used for the operation of the non-volatile memory device 400, based on the control signals CTLs. The voltage generator 470 may receive a power PWR from the memory controller 310. The word line voltages VWLs may be applied to the plurality of word lines WLs through the address decoder 500.

For example, during the erase operation, the voltage generator 470 may apply an erase voltage to a well of the memory block, and may apply a ground voltage to entire word lines of the memory block. During the erase verification operation, the voltage generator 470 may apply an erase verification voltage to the entire word lines of the memory block, or sequentially apply the erase verification voltage to word lines in a word line basis.

For example, during the program operation, the voltage generator 470 may apply a program voltage to the first word line, and may apply a program pass voltage to the unselected word lines. In addition, during the program verification operation, the voltage generator 470 may apply a program verification voltage to the first word line, and may apply a verification pass voltage to the unselected word lines.

In addition, during the read operation, the voltage generator 470 may apply a read voltage to the first word line, and may apply a read pass voltage to the unselected word lines.

The page buffer circuit 430 may be coupled to the memory cell array 420 through the plurality of bit lines BLs. The page buffer circuit 430 may include a plurality of page buffers. In some example embodiments, one page buffer may be connected to one bit line. In other example embodiments, one page buffer may be connected to two or more bit lines.

The page buffer circuit 430 may temporarily store data to be programmed in a selected page or data read out from the selected page.

The data input/output circuit 440 may be coupled to the page buffer circuit 430 through data lines DLs. During the program operation, the data input/output circuit 440 may receive the data DTA from the memory controller 310, and provide the data DTA to the page buffer circuit 430 based on the column address C_ADDR received from the control circuit 460. During the read operation, the data input/output circuit 440 may provide the data DATA, which are stored in the page buffer circuit 430, to the memory controller 310 based on the column address C_ADDR received from the control circuit 460.

In addition, the page buffer circuit 430 and the data input/output circuit 440 may read data from a first area of the memory cell array 420, and write the read data to a second area of the memory cell array 420. Thus, the page buffer circuit 430 and the data input/output circuit 440 may perform a copy-back operation. The page buffer circuit 430 and the data input/output circuit 440 may be controlled by the control circuit 460.

Figure 14:
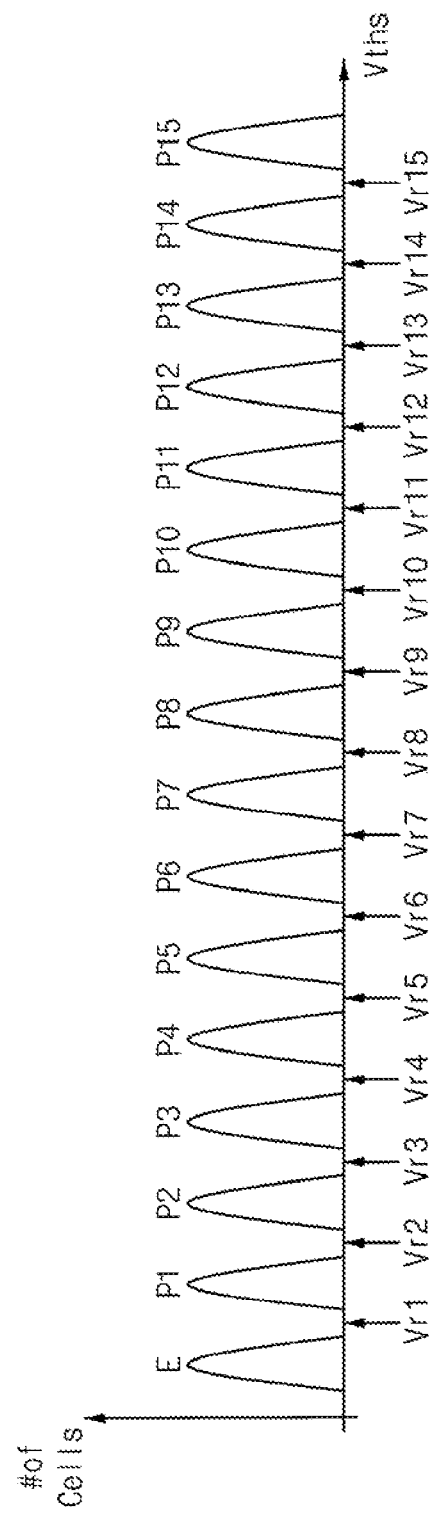
FIG. 14 shows a threshold voltage distribution of memory cells according to example embodiments.

FIG. 14 shows a threshold voltage distribution of the memory cells according to example embodiments. More particularly, FIG. 14 shows the threshold voltage distribution of a case in which the memory cells are quadruple level cells QLCs respectively storing M bits of data (M is an integer equal to or greater than four).

Referring to FIG. 14, a horizontal axis indicates threshold voltages Vths, and a vertical axis indicates the number of the memory cells. Each of the memory cells may have a state from among an erase state E and a first program state P1 through a fifteenth program state P15. As the states of the memory cells are changed from the erase state E to the fifteenth program state P15, more electrons may be injected into floating gates of the memory cells.

A first read voltage Vr1 may have a voltage level between a distribution of memory cells under the erase state E and a distribution of memory cells under the first program state P1. Likewise, an $i^{th}$ read voltage Vri (i is a natural number equal to or greater than 2 and less than or equal to 15) may have a voltage level between a distribution of memory cells under an $i-1^{th}$ program state Pi-1 and a distribution of memory cells under $i^{th}$ program state Pi.

The first read voltage Vr1 through the fifteenth read voltage Vr15 are read voltages used for distinguishing memory cells under different program states. For convenience of explanation, the first read voltage Vr1 through the fifteenth read voltage Vr15 will be referred to as read voltages having different levels. In other words, the first read voltage Vr1 through the fifteenth read voltage Vr15 are read voltages having different read voltage levels.

Figure 15:
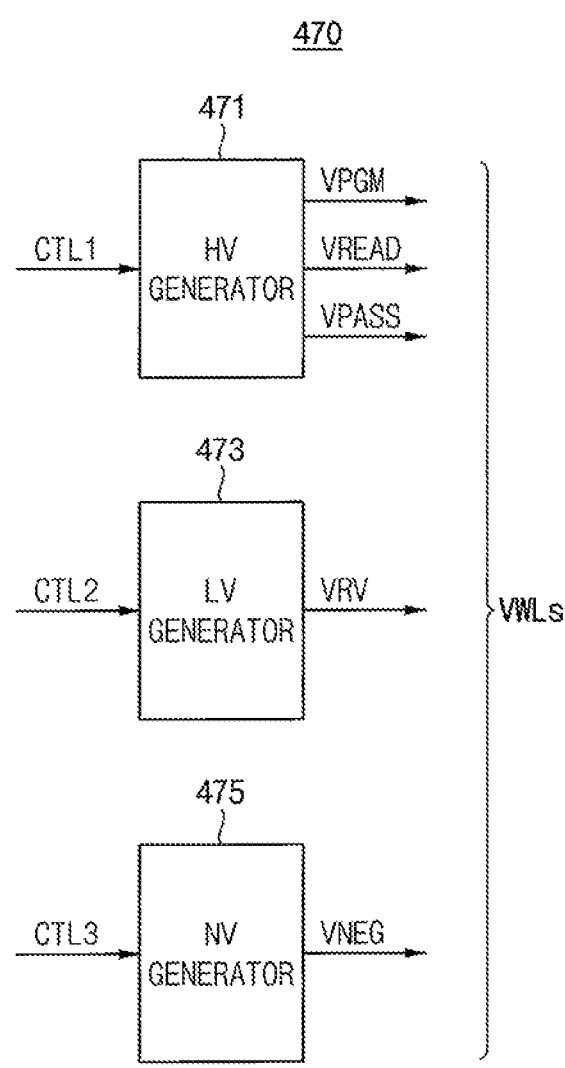
FIG. 15 is a block diagram illustrating a voltage generator in the nonvolatile memory device of FIG. 10 according to example embodiments.

FIG. 15 is a block diagram illustrating the voltage generator in the nonvolatile memory device of FIG. 10 according to example embodiments.

Referring to FIG. 15, the voltage generator 470 includes a high voltage (HV) generator 471 and a low voltage (LV) generator 473. The voltage generator 470 may further include a negative voltage (NV) generator 475.

The high voltage generator 471 may generate a program voltage VPGM, a pass voltage VPASS, and a read pass voltage VREAD according to operations directed by the command CMD, in response to a first control signal CTL1.

The low voltage generator 473 may generate a read voltage VRV according to operations directed by the command CMD, in response to a second control signal CTL2.

The negative voltage generator 475 may generate a negative voltage VNEG according to operations directed by the command CMD, in response to a third control signal CTL3.

The first through third control signals CTL1, CTL2, and CTL3 may be included in the control signal CTLs in FIG. 10. The program voltage PGM, the pass voltage VPASS, the read pass voltage VREAD, the read voltage VRV, and the negative voltage VNEG may be included in the word line voltages VELs.

FIG. 16 is a circuit diagram illustrating an example of an address decoder in the nonvolatile memory device of FIG. 10 according to example embodiments.

Referring to FIGS. 10 and 16, the address decoder 500 may include a decoder 510, a high voltage switch circuit 530, and a voltage transfer circuit 540. The address decoder 500 may further include an inverter 521 and a switch 523. The voltage transfer circuit 540 may include a plurality of pass transistors PTG, PT1~PTn, and PTS.

The decoder 510 may be a block decoder for selecting one memory block of the memory cell array 420. The decoder 510 may include a NAND gate 511 and an inverter 513.

The NAND gate 511 may perform a NAND operation on decoding signals Oi, Pi, Qi, and Ri that are provided by the row address R_ADDR. The inverter 513 may invert an output of the NAND gate 511. An output of the inverter 513 may be transmitted to the node N41 as a low voltage block selection signal (e.g., the enable signal EN). Although not illustrated in FIG. 16, the decoder 510 may further include an element for blocking the output of the NAND gate 511 depending on whether the selected block is a bad block.

When all the decoding signals Oi, Pi, Qi, and Ri are activated, the node N31 may be set to a high level and the switch 523 for disabling the string selection line SSL may be blocked (e.g., turned off). The high voltage switch circuit 530 may output a logic value of the node N41 as a boosted block selection signal (e.g., the output signal OS) that is boosted to a high voltage. The boosted block selection signal having the high voltage may be transferred to a block word line BWL. The pass transistors PTG, PT1~PTn, and PTS may be switched by the boosted block selection signal having the high voltage transferred through the block word line BWL.

The pass transistors PTG, PT1~PTn, and PTS may transmit voltages VGS, VW1, VW2, . . . , VW(n−1), VWn, and VSS that are generated from the voltage generator 470 to word lines WL1, WL2, . . . , WL(n−1), and WLn and selection lines SSL and GSL. The voltages transmitted by the pass transistors PTG, PT1~PTn, and PTS may be a high voltage relatively higher than a voltage driving a general circuit. Thus, the pass transistors PTG, PT1~PTn, and PTS may include a high voltage transistor being driven based on a relatively high voltage. A channel of the high voltage transistor may be formed to be longer than a channel of a low voltage transistor so as to endure a relatively high voltage (e.g., to prevent punch through between a source electrode and a drain electrode). In addition, a gate oxide layer of the high voltage transistor may be formed to be thicker than a gate oxide layer of the low voltage transistor so as to endure a relatively high voltage, (e.g., withstand a relatively high electric potential difference between a gate electrode and the drain/source electrodes). Accordingly, the high voltage transistor may have a wider chip area than the low voltage transistor.

The high voltage switch circuit 530 may receive the high voltage VPP and the negative voltage VNEG, and may employ the high voltage switch circuit 200 of FIG. 7A. Therefore, the high voltage switch circuit 530 may shift a level of the enable signal EN swinging between the power supply voltage VPR and the ground voltage VSS to provide to gates of the pass transistors PTG, PT1~PTn, and PTS with the output signal OS swinging between the high voltage VPP and the negative voltage VNEG.

In some example embodiments, the high voltage VPP provided to the high voltage switch circuit 530 may be generated from a separate high voltage generator disposed outside the nonvolatile memory device 400. In other example embodiments, the high voltage VPP provided to the high voltage switch circuit 530 may be generated from the voltage generator 470 included in the nonvolatile memory device 400.

Figure 17:
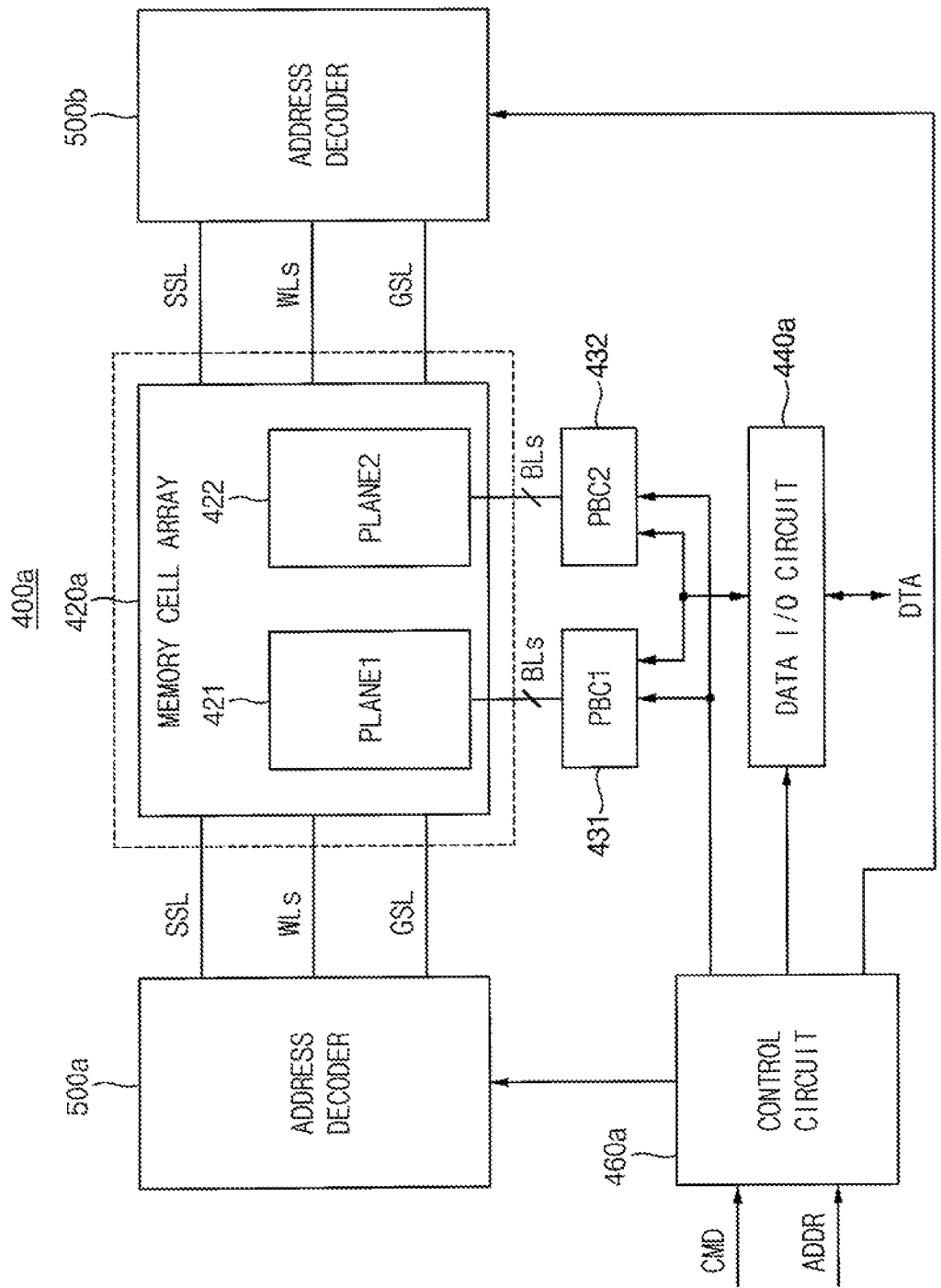
FIG. 17 is a block diagram illustrating a nonvolatile memory device according to example embodiments.

FIG. 17 is a block diagram illustrating a nonvolatile memory device according to example embodiments.

A nonvolatile memory device 400a may have multi-plane configuration. Although, the nonvolatile memory device 400a of FIG. 17 is illustrated as including two planes such as a first plane 421 and a second plane 422, the nonvolatile memory device 400a may include, e.g., a four plane configuration or a six plane configuration.

The nonvolatile memory device 400a may include a memory cell array 420a, a first address decoder 500a, a second address decoder 500b, a first page buffer circuit 431, a second page buffer circuit 432, a data input/output circuit 440a, and a control circuit 460a.

The memory cell array 420a may include a first plane 421 and a second plane 422, and each of the first plane 421 and the second plane 422 may include a plurality of memory blocks as illustrated in FIG. 11.

Each memory block of each of the first plane 421 and the second plane 422 may be coupled to respective one of the first address decoder 500a and the second address decoder 500b through a string selection line SSL, a plurality of word lines WLs, and a ground selection line GSL. The memory blocks in the first plane 421 may be coupled to the first page buffer circuit 431 through a plurality of bit lines BLs. The memory blocks in the second plane 422 may be coupled to the second page buffer circuit 432 through a plurality of bit lines BLs.

The first page buffer circuit 431 and the second page buffer circuit 432 may be coupled to the data input/output circuit 440a. The control circuit 460a may control the first address decoder 500a, the second address decoder 500b, the first page buffer circuit 431, the second page buffer circuit 432, and the data input/output circuit 440a based on the command CMD and the address ADDR from the memory controller 310.

Each of the first address decoder 500a and the second address decoder 500b may employ the address decoder 500 of FIG. 16. Therefore, each of the first address decoder 500a and the second address decoder 500b may employ the high voltage switch circuit 200 of FIG. 7A.

Each of the first address decoder 500a and the second address decoder 500b in the nonvolatile memory device 400a may provide negative voltages covering wide ranges corresponding to changes of word line loading based on a plane independent read (PIR) scheme and a plane independent core (PIC) scheme. Thus, each of the first address decoder 500a and the second address decoder 500b may shift a level of the enable signal to provide, to gates of pass transistors coupled to a corresponding block, a block selection signal swinging between the high voltage and the negative voltage.

Figure 18:
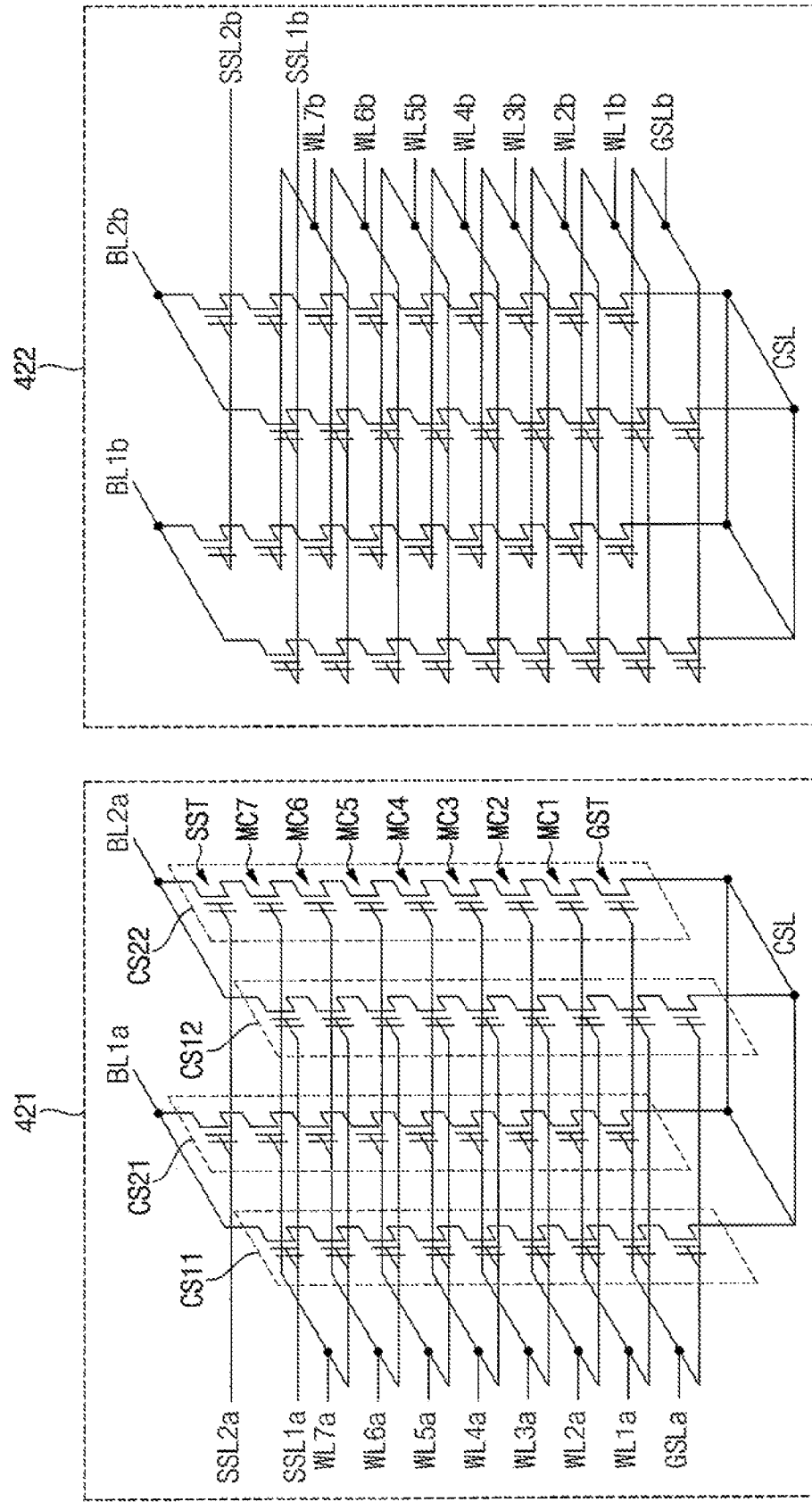
FIG. 18 illustrates a first plane and a second plane of the nonvolatile memory device of FIG. 17 according to example embodiments.

FIG. 18 illustrates a first plane and a second plane of the nonvolatile memory device of FIG. 17 according to example embodiments.

Referring to FIGS. 17 and 18, the memory cell array 420a may include the first plane 421 and a second plane 422. A plurality of memory blocks may be included in the first and second planes 421 and 422. A plurality of cell strings are included in each of the memory blocks. For example, a plurality of cell strings CS11, CS12, CS21, and CS22 may be included in one of the memory blocks included in the first plane 421. Each of the planes 421 and 422 may include a plurality of memory blocks, and one of the memory blocks may include a plurality of string select lines SSL1a and SSL2a to select at least one of the cell strings CS11, CS12, CS21, and CS22. For example, when a select voltage is applied to the first string select line SSL1a of the first plane 421, the first and second cell strings CS11 and CS12 may be selected. Similarly, when a select voltage is applied to the second string select line SSL2a of the first plane 421, the third and fourth cell strings CS21 and CS22 may be selected.

In example embodiments, the first and second planes 421 and 422 may have substantially the same physical structure. For example, similar to the first plane 421, the second plane 422 may include a plurality of memory blocks and a plurality of cell strings disposed on a single plane. Similarly, the second plane 422 may include a plurality of string select lines SSL1*b* and SSL2*b* configured to select at least one of multiple cell strings.

The first and second planes 421 and 422 do not share a word line, a bit line, a string select line, a ground select line, and a common source line. An example has been described where each plane is connected to two bit lines and seven word lines. However, each plane may be connected to three or more bit lines and seven or more or less word lines. For example, the first plane 421 may be connected to bit lines BL1*a* and BL2*a*, word lines WL1*a*-WL7*a*, and ground selection line GSLa, whereas the second plane 422 may be connected to bit lines BL1*b* and BL2*b*, word lines WL1*b*-WL7*b*, and ground selection line GSLb.

Each of the cell strings CS11, CS12, CS21, and CS22 may include at least one string select transistor, memory cells, and at least one ground select transistor. For example, a single ground select transistor GST, a plurality of memory cells MC1 to MC7, and a single string select transistor SST may be sequentially formed at the single cell string CS22 to be perpendicular to a substrate. The other cell strings may also have the same structure as the cell string CS22.

In example embodiments, a string select line connected to each of the planes 421 and 422 may be exclusively connected to only one corresponding plane. For example, each of the string select lines SSL1*a* and SSL2*a* may be connected to only the first plane 421. Similarly, each of the string select lines SSL1*b* and SSL2*b* may be connected to only the second plane 422. Thus, a single string select line may select only cell strings include in a single plane. In addition, each string select line may be independently controlled to independently select cell strings in each plane.

For example, a select voltage may be independently applied to the first string select line SSL1*a* to independently select the cell strings CS11 and CS12. When the select voltage is applied to the first string select line SSL1*a*, the select voltage turns on a string select transistor of the corresponding cell strings CS11 and CS12. When the string select transistor is turned on, memory cells of the cell strings CS11 and CS12 and a bit line are electrically connected to each other.

Meanwhile, when an unselect voltage is applied to the first string select line SSL1*a*, the string select transistor of the cell strings CS11 and CS12 may be turned off and the cell strings CS11 and CS12 may be unselected. Thus, the memory cells of the cell strings CS11 and CS12 are electrically insulated from a bit line.

According to the above-described configuration, string select lines separated in each plane are provided. The separated string select line structure may minimize an effect caused by a defect that occurs at some of the string select lines. The string select lines separated in each plane may be advantageous in independently selecting a cell string in each plane. Thus, cell strings included in the first plane 421 may be selected fully independently of cell strings included in the second plane 422. The independent selection structure allows the nonvolatile memory device 400*a* to be easily controlled.

Figure 19:
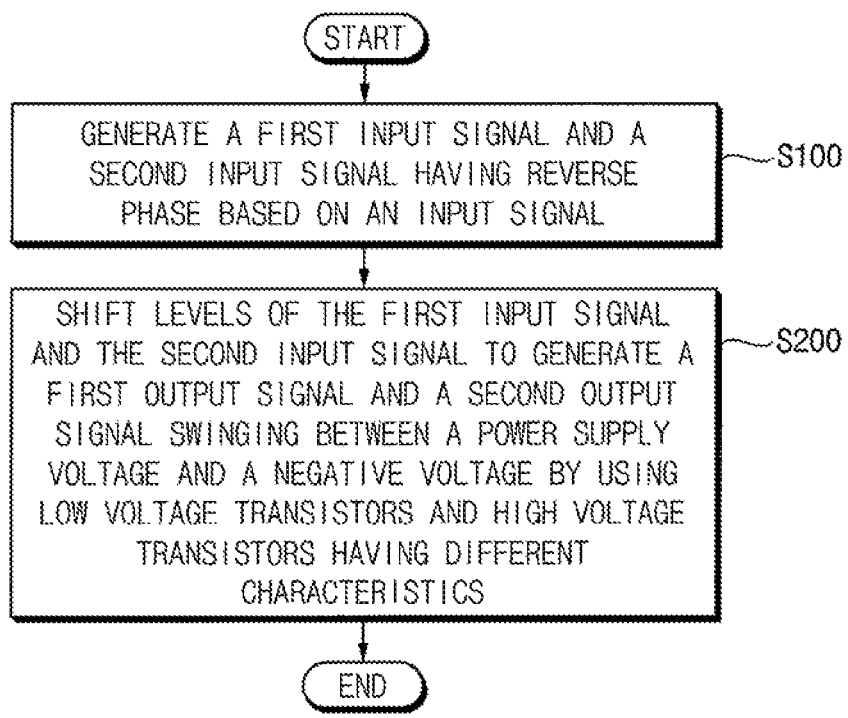
FIG. 19 is a flow chart illustrating a method of operating a negative level shifter according to example embodiments.

FIG. 19 is a flow chart illustrating a method of operating a negative level shifter according to example embodiments.

Referring to FIGS. 1 through 6 and 19, in operation S100, a first input signal IN1 and a second input signal IN2 having a reverse phase are generated based on an input signal IN using a first inverter 111 and a second inverter 113 in a negative level shifter 100.

In operation S200, a shifting circuit 120 in the negative level shifter 100 shifts levels of the first input signal IN1 and the second input signal IN2 to generate a first output signal OUT1 and a second output signal OUT2 swinging between a power supply voltage VPR and a negative voltage VNEG using low voltage transistors and high voltage transistors having different characteristics.

A latch circuit 130 in the negative level shifter 100 latches the first output signal OUT1 and the second output signal OUT, and drives the second output signal OUT2 and the first output signal OUT1 complementarily to either a level of the power supply voltage VPR or a level of the negative voltage VNEG, based on voltage levels at a first output node NO1 and a second output node NO2, respectively.

Figure 20:
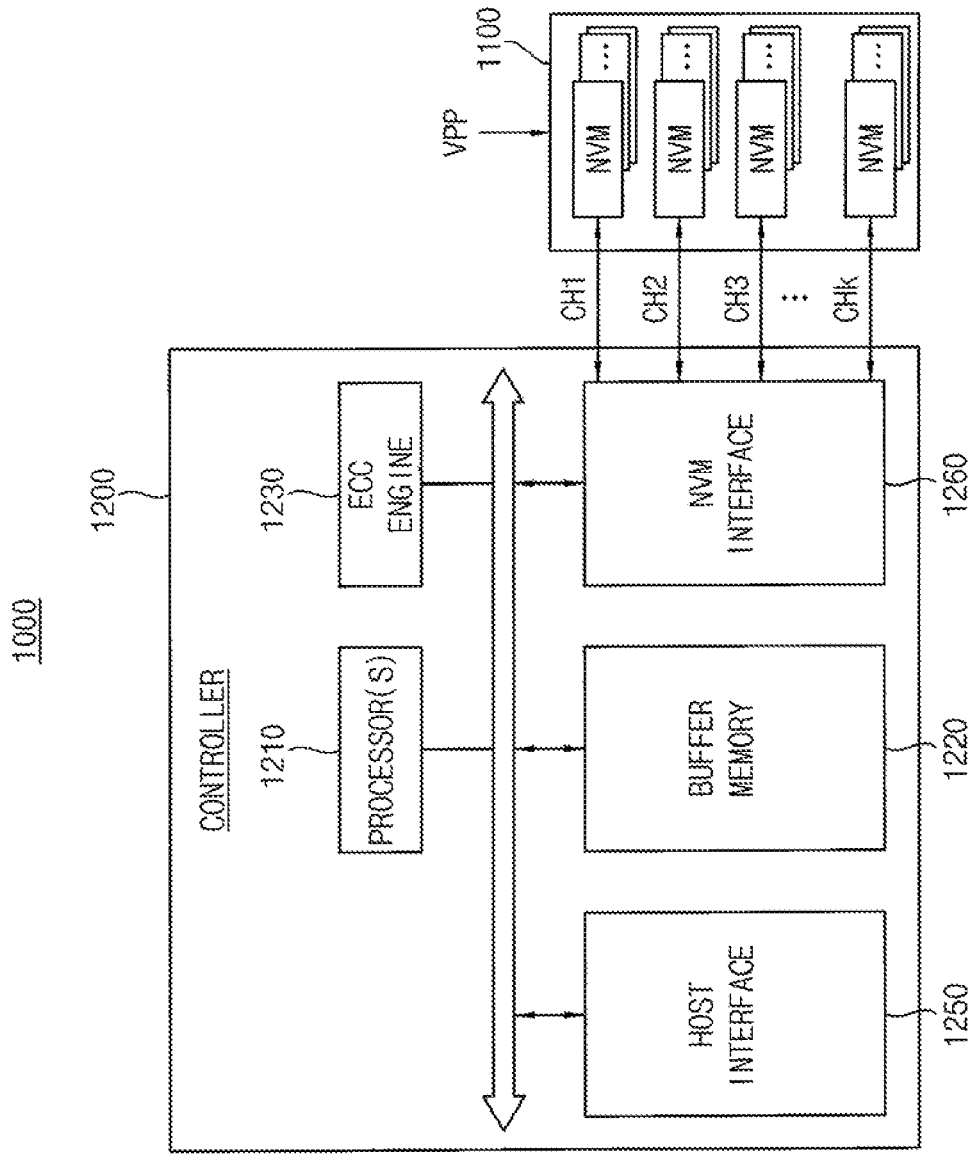
FIG. 20 is a block diagram illustrating a storage device that includes a nonvolatile memory device according to example embodiments.

FIG. 20 is a block diagram illustrating a storage device that includes a nonvolatile memory device according to example embodiments.

Referring to FIG. 20, a storage device 1000 includes a plurality of nonvolatile memory devices 1100 and a controller 1200. For example, the storage device 1000 may be any storage device such as an embedded multimedia card (eMMC), a universal flash storage (UFS), a solid state disc or solid state drive (SSD), etc.

The controller 1200 may be connected to the nonvolatile memory devices 1100 via a plurality of channels CH1, CH2, CH3, . . . , CHk. The controller 1200 may include one or more processors 1210, a buffer memory 1220, an error correction code (ECC) engine 1230, a host interface 1250, and a nonvolatile memory (NVM) interface 1260.

The buffer memory 1220 may store data used to drive the controller 1200. The ECC engine 1230 may calculate error correction code values of data to be programmed during a program operation, and may correct an error of read data using an error correction code value during a read operation. In a data recovery operation, the ECC engine 1230 may correct an error of data recovered from the nonvolatile memory devices 1100. The host interface 1250 may provide an interface with an external device. The nonvolatile memory interface 1260 may provide an interface with the nonvolatile memory devices 1100.

Each of the nonvolatile memory devices 1100 may correspond to the nonvolatile memory device according to example embodiments, and may be optionally supplied with an external high voltage VPP.

Figure 21:
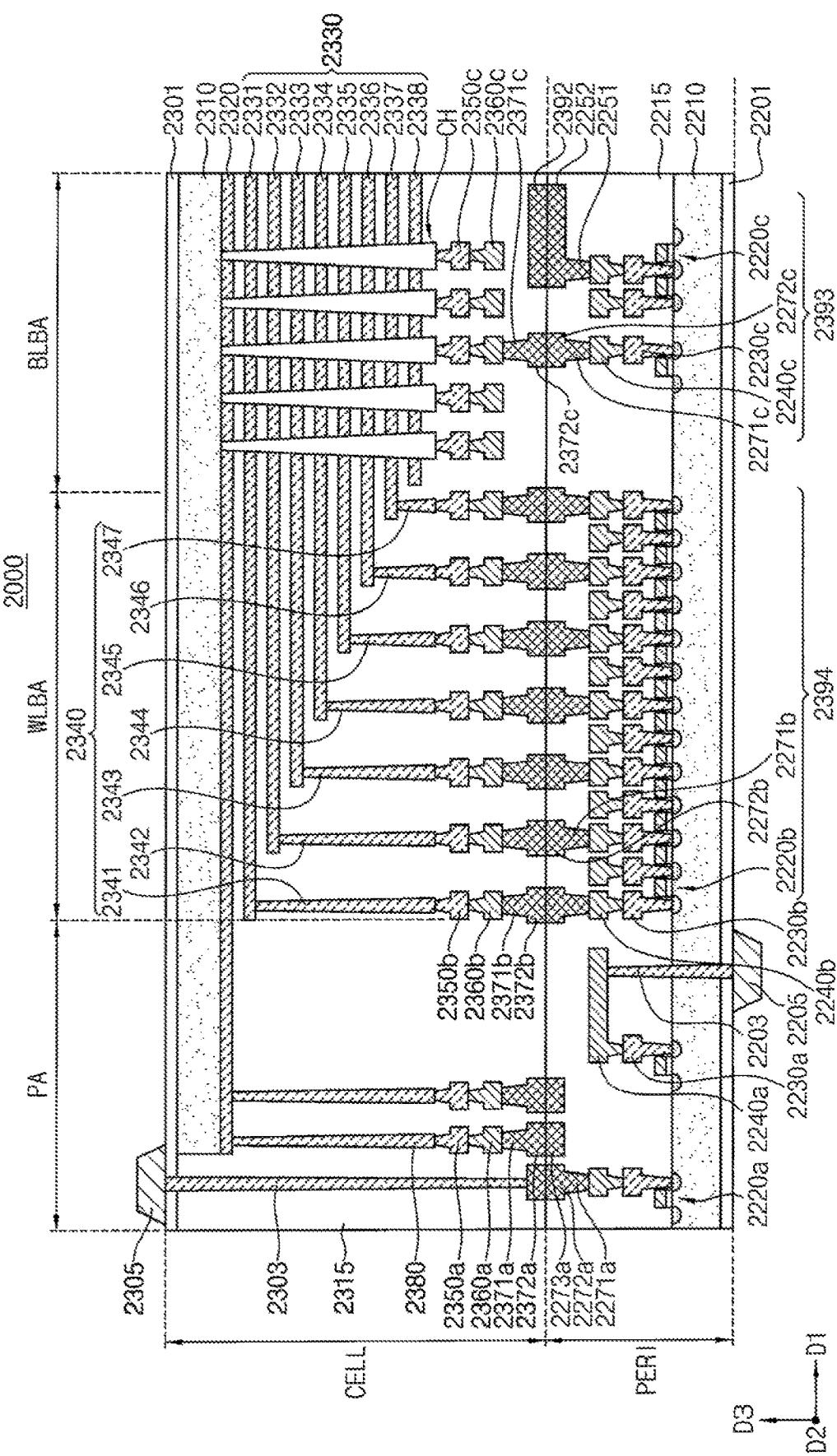
FIG. 21 is a cross-sectional view of a nonvolatile memory device according to example embodiments.

FIG. 21 is a cross-sectional view of a nonvolatile memory device according to example embodiments.

Referring to FIG. 21, a nonvolatile memory device or a memory device 2000 may have a chip-to-chip (C2C) structure. The C2C structure may refer to a structure formed by manufacturing an upper chip including a memory cell region (or a cell region) CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, the bonding metals may include copper (Cu) and the chips may be bonded using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 2000 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an example embodiment illustrate in FIG. 25, although only the first metal layers 2230a, 2230b, and 2230c and the second metal layers 2240a, 2240b, and 2240c are shown and described, the example embodiment is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like. Further, the upper bonding metals 2371b and 2372b in the cell region CELL may be referred as first metal pads, and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of word lines 2331, 2332, 2333, 2334, 2335, 2336, 2337, and 2338 (collectively, 2330) may be stacked in a third direction D3 (e.g., a Z-axis direction), perpendicular to an upper surface of the second substrate 2310. At least one string selection line and at least one ground selection line may be arranged on and below the plurality of word lines 2330, respectively, and the plurality of word lines 2330 may be disposed between the at least one string selection line and the at least one ground selection line.

In the bit line bonding area BLBA, a channel structure CH may extend in the third direction D3 (e.g., the Z-axis direction), perpendicular to the upper surface of the second substrate 2310, and pass through the plurality of word lines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit line contact, and the second metal layer 2360c may be a bit line. In an example embodiment, the bit line 2360c may extend in a second direction D2 (e.g., a Y-axis direction), parallel to the upper surface of the second substrate 2310.

In an example embodiment illustrated in FIG. 25, an area in which the channel structure CH, the bit line 2360c, and the like are disposed may be defined as the bit line bonding area BLBA. In the bit line bonding area BLBA, the bit line 2360c may be electrically connected to the circuit elements 2220c providing a page buffer 2393 in the peripheral circuit region PERI. The bit line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word line bonding area WLBA, the plurality of word lines 2330 may extend in a first direction D1 (e.g., an X-axis direction), parallel to the upper surface of the second substrate 2310 and perpendicular to the second direction D2, and may be connected to a plurality of cell contact plugs 2341, 2342, 2343, 2344, 2345, 2346, and 2347 (i.e., 2340). The plurality of word lines 2330 and the plurality of cell contact plugs 2340 may be connected to each other in pads provided by at least a portion of the plurality of word lines 2330 extending in different lengths in the first direction D1. A first metal layer 2350b and a second metal layer 2360b may be connected to an upper portion of the plurality of cell contact plugs 2340 connected to the plurality of word lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word line bonding area WLBA.

The plurality of cell contact plugs 2340 may be electrically connected to the circuit elements 2220b forming a row decoder 2394 in the peripheral circuit region PERI. In an example embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

First and second input/output pads 2205 and 2305 may be disposed in the external pad bonding area PA. For example, a lower insulating film 2201 covering a lower surface of the first substrate 2210 may be formed below the first substrate 2210, and the first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and the second input/output pad 2305 may be disposed on the upper insulating film 2301. The second input/output pad 2305 may be connected to at least one of the plurality of circuit elements 2220a, 2220b, and 2220c disposed in the peripheral circuit region PERI through a second input/output contact plug 2303. In the present example embodiment, the second input/output pad 2305 is electrically connected to a circuit element 2220a.

According to example embodiments, the second substrate 2310 and the common source line 2320 may not be disposed in an area in which the second input/output contact plug 2303 is disposed. Also, the second input/output pad 2305 may not overlap the word lines 2330 in the third direction D3 (e.g., the Z-axis direction). The second input/output contact plug 2303 may be separated from the second substrate 2310 in the direction, parallel to the upper surface of the second substrate 2310, and may pass through an interlayer insulating layer 2315 of the cell region CELL to be connected to the second input/output pad 2305.

According to example embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. Alternatively, the memory device 2000 may include both the first input/output pad 2205 and the second input/output pad 2305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 2000 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bit line bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The negative level shifter according to example embodiments may be included in the row decoder 2394 or a high voltage switch circuit in the row decoder 2394, and a block selection signal swinging between a high voltage and a negative voltage may be applied through the bonding structure.

Example embodiments may be applied to various devices and systems that include the nonvolatile memory devices. For example, example embodiments may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

Example embodiments may be applied to various electronic devices and systems including a nonvolatile memory device. For example, example embodiments may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

By way of summation and review, as a number of bits stored in a memory cell of a flash memory device increase, a range of a negative voltage used in the flash memory device may also increase.

As described above, a negative level shifter according to example embodiments may include low voltage transistors and high voltage transistors having different characteristics, may provide enhanced reliability margin under voltage equal to or less than the negative voltage, and may provide enhanced on-off characteristic by turning-on the high voltage transistors by coupling the gates of the high voltage transistors to the negative voltage. Embodiments may provide a negative level shifter included in a nonvolatile memory device, capable of enhancing reliability margin and operating characteristic. Some example embodiments provide a nonvolatile memory device including a negative level shifter capable of enhancing reliability margin and operating characteristic.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A negative level shifter in a nonvolatile memory device, the negative level shifter comprising:
   a shifting circuit configured to shift levels of a first input signal and a second input signal to provide a first output signal and a second output signal having complementary levels at a first output node and a second output node, respectively, using low voltage transistors and high voltage transistors having different characteristics, the first input signal being obtained by inverting an input signal and the second input signal being obtained by inverting the first input signal; and
   a latch circuit, connected to the shifting circuit at the first output node and the second output node, configured to latch the first output signal and the second output signal, configured to receive a negative voltage having a level smaller than a ground voltage, and configured to drive the second output signal and the first output signal complementarily to either a level of a power supply voltage or a level of the negative voltage, based on voltage levels at the first output node and the second output node, respectively.

2. The negative level shifter as claimed in claim 1, wherein the shifting circuit includes:
   a first low voltage transistor which has a source receiving the first input signal, a gate coupled to the ground voltage, and a drain coupled to a first internal node;
   a second low voltage transistor which has a source receiving the second input signal, a gate coupled to the ground voltage, and a drain coupled to a second internal node;
   a first high voltage transistor which has a source coupled to the drain of the first low voltage transistor at the first internal node, a gate coupled to the negative voltage, and a drain coupled to the first output node; and
   a second high voltage transistor which has a source coupled to the drain of the second low voltage transistor at the second internal node, a gate coupled to the negative voltage, and a drain coupled to the second output node.

3. The negative level shifter as claimed in claim 2, wherein the power supply voltage is applied to a body of the first high voltage transistor and a body of the second high voltage transistor.

4. The negative level shifter as claimed in claim 3, wherein each threshold voltage of the first high voltage transistor and the second high voltage transistor increases in response to the power supply voltage applied to the body of each of the first high voltage transistor and the second high voltage transistor.

5. The negative level shifter as claimed in claim 2, wherein each on resistance of the first high voltage transistor and the second high voltage transistor, in a case where the first high voltage transistor and the second high voltage transistor are turned-on, decreases in response to a negative boosting of the negative voltage coupled to the each gate of the first high voltage transistor and the second high voltage transistor.

6. The negative level shifter as claimed in claim 2, wherein the power supply voltage is applied to a body of the first low voltage transistor and a body of the second low voltage transistor.

7. The negative level shifter as claimed in claim 2, wherein:
   the first low voltage transistor is turned-on in response to the first input signal having the level of the power supply voltage; and
   the first high voltage transistor is configured to provide the first output signal having the level of the power supply voltage in response to the first internal node having the level of the power supply voltage.

8. The negative level shifter as claimed in claim 2, wherein:
   the first low voltage transistor is turned-off in response to the first input signal having the level of the ground voltage; and
   the first high voltage transistor is configured to provide the first output signal having a level between the negative voltage and a threshold voltage of the first high voltage transistor in response to the first internal node having a level of an intermediate voltage between the negative voltage and the threshold voltage of the first high voltage transistor.

9. The negative level shifter as claimed in claim 2, wherein:
   each of the first low voltage transistor and the second low voltage transistor includes a low voltage p-channel metal-oxide semiconductor (PMOS) transistor; and
   each of the first high voltage transistor and the second high voltage transistor includes a high voltage PMOS transistor.

10. The negative level shifter as claimed in claim 9, wherein the low voltage PMOS transistor has a gate dielectric layer having a first thickness, the high voltage PMOS transistor has a gate dielectric layer having a second thickness, and the first thickness is less than the second thickness.

11. The negative level shifter as claimed in claim 1, wherein the latch circuit includes:
   a first high voltage n-channel metal-oxide semiconductor (NMOS) transistor which has a drain coupled to the first output node, a gate coupled to the second output node, and a source coupled to the negative voltage; and
   a second high voltage NMOS transistor which has a drain coupled to the second output node, a gate coupled to the first output node, and a source coupled to the negative voltage.

12. The negative level shifter as claimed in claim 11, wherein the shifting circuit includes:
   a first low voltage transistor which has a source receiving the first input signal, a gate coupled to the ground voltage, and a drain coupled to a first internal node;
   a second low voltage transistor which has a source receiving the second input signal, a gate coupled to the ground voltage, and a drain coupled to a second internal node;
   a first high voltage transistor which has a source coupled to the drain of the first low voltage transistor at the first internal node, a gate coupled to the negative voltage, and a drain coupled to the first output node; and
   a second high voltage transistor which has a source coupled to the drain of the second low voltage transistor at the second internal node, a gate coupled to the negative voltage, and a drain coupled to the second output node.

13. The negative level shifter as claimed in claim 12, wherein:
a first turn-on voltage to turn on the first high voltage NMOS transistor varies in response to variance of a level of the negative voltage; and
a second turn-on voltage to turn on the first high voltage transistor varies in response to variance of the first turn-on voltage.

14. The negative level shifter as claimed in claim 1, further comprising:
a first inverter configured to invert the input signal to provide the first input signal to the shifting circuit; and
a second inverter configured to invert the first input signal to provide the second input signal to the shifting circuit.

15. The negative level shifter as claimed in claim 14, wherein each of the first inverter and the second inverter is connected between the power supply voltage and the ground voltage.

16. A nonvolatile memory device, comprising:
a memory cell array including a nonvolatile memory cell coupled to a word line and a bit line;
a pass transistor configured to transfer a first driving voltage to the word line; and
a high voltage switch circuit configured to boost a level of an enable signal to a level of a second driving voltage to provide an output signal to a gate of the pass transistor,
wherein the high voltage switch circuit includes:
a negative level shifter configured to receive the first driving voltage and a negative voltage having a level lower than a ground voltage, and configured to shift a level of the enable signal to provide a first gate signal and a second gate signal having complementary levels and swinging between the first driving voltage and the negative voltage; and
a plurality of transistors connected to a first node, the gate of the pass transistor, and an output terminal to provide the output signal, and configured to drive the output terminal to a level of the second driving voltage or discharge the output terminal to a level of the negative voltage.

17. The nonvolatile memory device as claimed in claim 16, wherein the plurality of transistors include:
a first transistor configured to transfer the second driving voltage to the word line in response to the first gate signal;
a first depletion mode transistor configured to transfer the second driving voltage to the first transistor in response to the output signal fed-back from the output terminal;
a second depletion mode transistor coupled between the output terminal and the first node, and having a gate coupled to an internal power supply voltage;
a second transistor configured to drive the first node to a level of the first driving voltage in response to the second gate signal; and
a third transistor configured to discharge the first node to a level of the negative voltage in response to the first gate signal, and
wherein, when the enable signal is deactivated, the third transistor is turned-on in response to the first gate signal and a level of the output signal is decreased to the level of the negative voltage by the third transistor and the second depletion mode transistor.

18. The nonvolatile memory device as claimed in claim 16,
wherein the nonvolatile memory cell is configured to M-bits (M being an integer equal to or greater than four), and
wherein the negative level shifter includes:
a shifting circuit configured to shift levels of the enable signal and an inverted enable signal to provide the first gate signal and the second gate signal having complementary levels at a first output node and a second output node, respectively, the inverted enable signal being obtained by inverting the enable signal; and
a latch circuit, connected to the shifting circuit at the first output node and the second output node, configured to latch the first gate signal and the second gate signal, configured to receive the negative voltage, configured to either maintain the second gate signal at a level of the first driving voltage or discharge the second gate signal to a level of the negative voltage based on a voltage level of the first output node, and configured to either discharge the first gate signal to the level of the negative voltage or maintain the first gate signal at the level of the first driving voltage based on a voltage level of the second output node.

19. The nonvolatile memory device as claimed in claim 18, wherein the shifting circuit includes:
a first low voltage transistor which has a source receiving the inverted enable signal, a gate coupled to the ground voltage, and a drain coupled to a first internal node;
a second low voltage transistor which has a source receiving the enable signal, a gate coupled to the ground voltage, and a drain coupled to a second internal node;
a first high voltage transistor which has a source coupled to the drain of the first low voltage transistor at the first internal node, a gate coupled to the negative voltage, and a drain coupled to the first output node; and
a second high voltage transistor which has a source coupled to the drain of the second low voltage transistor at the second internal node, a gate coupled to the negative voltage, and a drain coupled to the second output node,
wherein the first driving voltage is applied to a body of the first high voltage transistor and a body of the second high voltage transistor, and
wherein the latch circuit includes:
a first high voltage n-channel metal-oxide semiconductor (NMOS) transistor which has a drain coupled to the first output node, a gate coupled to the second output node, and a source coupled to the negative voltage; and
a second high voltage NMOS transistor which has a drain coupled to the second output node, a gate coupled to the first output node, and a source coupled to the negative voltage.

20. A negative level shifter in a nonvolatile memory device, the negative level shifter comprising:
a shifting circuit configured to shift levels of a first input signal and a second input signal to provide a first output signal and a second output signal having complementary levels at a first output node and a second output node, respectively, using low voltage transistors and high voltage transistors having different characteristics, the first input signal being obtained by inverting an input signal and the second input signal being obtained by inverting the first input signal; and
a latch circuit, connected to the shifting circuit at the first output node and the second output node, configured to latch the first output signal and the second output signal, configured to receive a negative voltage having a level smaller than a ground voltage, and configured to drive the second output signal and the first output signal complementary to either a level of a power supply voltage or a level of the negative voltage, based on voltage levels at the first output node and the second output node respectively, wherein the shifting circuit includes:

a first low voltage transistor which has a source receiving the first input signal, a gate coupled to the ground voltage, and a drain coupled to a first internal node;

a second low voltage transistor which has a source receiving the second input signal, a gate coupled to the ground voltage, and a drain coupled to a second internal node;

a first high voltage transistor which has a source coupled to the drain of the first low voltage transistor at the first internal node, a gate coupled to the negative voltage, and a drain coupled to the first output node; and a second high voltage transistor which has a source coupled to the drain of the second low voltage transistor at the second internal node, a gate coupled to the negative voltage, and a drain coupled to the second output node, and wherein the power supply voltage is applied to a body of the first high voltage transistor and a body of the second high voltage transistor.

* * * * *